(12) United States Patent
Yang et al.

(10) Patent No.: US 11,489,007 B2
(45) Date of Patent: Nov. 1, 2022

(54) DISPLAY PANEL AND DISPLAY DEVICE

(71) Applicant: Wuhan Tianma Micro-Electronics Co., Ltd., Wuhan (CN)

(72) Inventors: Xingxing Yang, Wuhan (CN); Yangzhao Ma, Wuhan (CN); Guofeng Zhang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 134 days.

(21) Appl. No.: 17/123,672

(22) Filed: Dec. 16, 2020

(65) Prior Publication Data

US 2022/0102421 A1    Mar. 31, 2022

(30) Foreign Application Priority Data

Sep. 30, 2020 (CN) .......................... 202011064044.2

(51) Int. Cl.
*H01L 27/15* (2006.01)
*H01L 33/62* (2010.01)

(52) U.S. Cl.
CPC ............ *H01L 27/156* (2013.01); *H01L 33/62* (2013.01)

(58) Field of Classification Search
CPC ... H01L 27/156; H01L 33/62; H01L 27/3218; H01L 27/3276; H01L 27/3246; H01L 27/3225; G06F 1/1686; G09G 3/3225
See application file for complete search history.

(56) References Cited

U.S. PATENT DOCUMENTS

| | | | | |
|---|---|---|---|---|
| 10,861,924 | B2 * | 12/2020 | Li | G09G 3/3677 |
| 11,049,998 | B2 * | 6/2021 | Ma | H01L 25/167 |
| 2020/0058726 | A1 * | 2/2020 | Ma | H01L 27/3216 |
| 2020/0110499 | A1 * | 4/2020 | Lee | H01L 27/323 |
| 2020/0342799 | A1 * | 10/2020 | Yang | H01L 27/14812 |
| 2021/0012706 | A1 * | 1/2021 | Yang | G09G 3/3225 |
| 2021/0208633 | A1 * | 7/2021 | Ma | G06F 1/1637 |
| 2021/0313405 | A1 * | 10/2021 | Xu | H01L 51/5237 |
| 2022/0093682 | A1 * | 3/2022 | Chang | H01L 27/32 |
| 2022/0173170 | A1 * | 6/2022 | Yang | G09G 3/3225 |

FOREIGN PATENT DOCUMENTS

| | | |
|---|---|---|
| CN | 110265455 A | 9/2019 |
| CN | 110288945 A | 9/2019 |
| CN | 210515985 U | 5/2020 |

* cited by examiner

*Primary Examiner* — Victor A Mandala
(74) *Attorney, Agent, or Firm* — Anova Law Group, PLLC

(57) ABSTRACT

Display panels and display devices are provided. The display panel may include a first display area, a second display area and a third display area with a light transmittance of the first display area being greater than a light transmittance of the third display area; first pixel circuits; second pixel circuits; third pixel circuits; first light-emitting units, second light-emitting units; third light-emitting units; and first signal lines extending along a first direction and spaced apart along a second direction intersecting the first direction. Each first signal line is connected with one or more first pixel circuits, one or more second pixel circuits and one or more third pixel circuit, and the one or more first pixel circuit and the one or more third pixel circuit electrically connected to each of at least one portion of first signal lines are misaligned along the first direction.

20 Claims, 17 Drawing Sheets

DISPLAY PANEL AND DISPLAY DEVICE

CROSS-REFERENCE TO RELATED APPLICATION

This application claims the priority of Chinese Patent Application No. 202011064044.2, filed on Sep. 30, 2020, the content of which is incorporated by reference in its entirety.

TECHNICAL FIELD

The present disclosure generally relates to the field of display technology and, more particularly, relates to a display panel and a display device.

BACKGROUND

With the rapid development of electronic devices, users' requirements for the screen-to-body ratio have become higher and higher, and the full-screen display of electronic devices attracts more and more attention in the industry.

Taking mobile phones, tablet computers, etc., as examples, in the current full-screen solution, a portion of the display area of the display panel is multiplexed as a photosensitive element integration area. Under such a configuration, photosensitive elements, such as front camera and infrared sensor element, can be arranged on the back of the photosensitive element integration area of the display panel, and light can pass through the photosensitive element integration area to the photosensitive elements to achieve corresponding functions, such as front camera and infrared sensing, etc.

In such a solution, to ensure the light transmittance of the display area multiplexed as the photosensitive element integration area, the pixel density (Pixels Per Inch, PPI) of this portion of the display area is usually set to be small. There is a need to increase the pixel density of the portion of the display area. The disclosed display panels and display devices are directed to solve one or more problems set forth above and other problems in the art.

SUMMARY

One aspect of the present disclosure provides a display panel. The display panel may include a first display area, a second display area and a third display area. The second display area at least partially surrounds the first display area; the third display area at least partially surrounds the second display area and the first display area; and a light transmittance of the first display area is greater than a light transmittance of the third display area. The display panel may also include a plurality of first pixel circuits at least partially disposed in the second display area; a plurality of second pixel circuits disposed in the second display area; a plurality of third pixel circuits disposed in the third display area; and a plurality of first light-emitting units disposed in the first display area as an array. A first light-emitting unit includes at least one first light-emitting element and a first pixel circuit is electrically connected to the at least one first light-emitting element. The display panel may also include a plurality of second light-emitting units disposed in the second display area as an array. A second light-emitting unit may include at least one second light-emitting element and a second pixel circuit is electrically connected to the at least one second light-emitting element. The display panel may also include a third light-emitting unit disposed in the third display area as an array. The third light-emitting unit may include at least one third light-emitting element and a third pixel circuit is electrically connected to the at least one third light-emitting element. The display panel may also include a plurality of first signal lines extending along a first direction and spaced apart along a second direction intersecting the first direction. Each first signal line of the plurality of first signal lines may be electrically connected with one or more first pixel circuits of the plurality of first pixels, one or more second pixel circuits of the plurality of second pixels and one or more of third pixel circuits of the plurality of third pixels, and the one or more first pixel circuits and the one or more third pixel circuits electrically connected to at least one portion of first signal lines of the plurality of first signal lines are misaligned along the first direction.

Another aspect of the present disclosure provides a display device. The display device may include a display panel. The display panel may include a first display area, a second display area and a third display area. The second display area at least partially surrounds the first display area; the third display area at least partially surrounds the second display area and the first display area; and a light transmittance of the first display area is greater than a light transmittance of the third display area. The display panel may also include a plurality of first pixel circuits at least partially disposed in the second display area; a plurality of second pixel circuits disposed in the second display area; a plurality of third pixel circuits disposed in the third display area; and a plurality of first light-emitting units disposed in the first display area as an array. A first light-emitting unit includes at least one first light-emitting element and a first pixel circuit is electrically connected to the at least one first light-emitting element. The display panel may also include a plurality of second light-emitting units disposed in the second display area as an array. A second light-emitting unit may include at least one second light-emitting element and a second pixel circuit is electrically connected to the at least one second light-emitting element. The display panel may also include a third light-emitting unit disposed in the third display area as an array. The third light-emitting unit may include at least one third light-emitting element and a third pixel circuit is electrically connected to the at least one third light-emitting element. The display panel may also include a plurality of first signal lines extending along a first direction and spaced apart along a second direction intersecting the first direction. Each first signal line of the plurality of first signal lines may be electrically connected with one or more first pixel circuits of the plurality of first pixels, one or more second pixel circuits of the plurality of second pixels and one or more of third pixel circuits of the plurality of third pixels, and the one or more first pixel circuits and the one or more third pixel circuits electrically connected to at least one portion of first signal lines of the plurality of first signal lines are misaligned along the first direction.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The present disclosure will be further described in detail below in conjunction with the drawings and embodiments. It can be understood that the specific embodiments described here are only used to explain the present disclosure, but not to limit the present disclosure. In addition, it should be noted that, for ease of description, the drawings only show part of the structure related to the present disclosure, but not all of the structure.

The features and exemplary embodiments of each aspect of the disclosure will be described in detail below. To make the objectives, technical solutions, and advantages of the disclosure more clear, the disclosure will be further described in detail below in conjunction with the drawings and specific embodiments. It should be understood that the specific embodiments described here are only configured to explain the present disclosure, and not configured to limit the present disclosure. For those skilled in the art, this disclosure can be implemented without some of these specific details. The following description of the embodiments is only to provide a better understanding of the present disclosure by showing examples of the present disclosure.

It should be noted that in this disclosure, relational terms such as first and second are only used to distinguish one entity or operation from another entity or operation, and do not necessarily require or imply one of these entities or operations to have any such actual relationship or order between.

It should be understood that when describing the structure of a component, when a layer or an area is referred to as being "on" or "above" another layer or another area, it can mean that it is directly on the other layer or area, or there are other layers or regions between it and another layer or another region. Further, if the component is turned over, the layer or area will be "below" or "below" another layer or area.

The present disclosure provides a display panel and a display device. The display panel and the display device of the embodiments of the present disclosure may be presented in various forms, and some examples will be described below with reference to the accompanying drawings.

Figure 1:
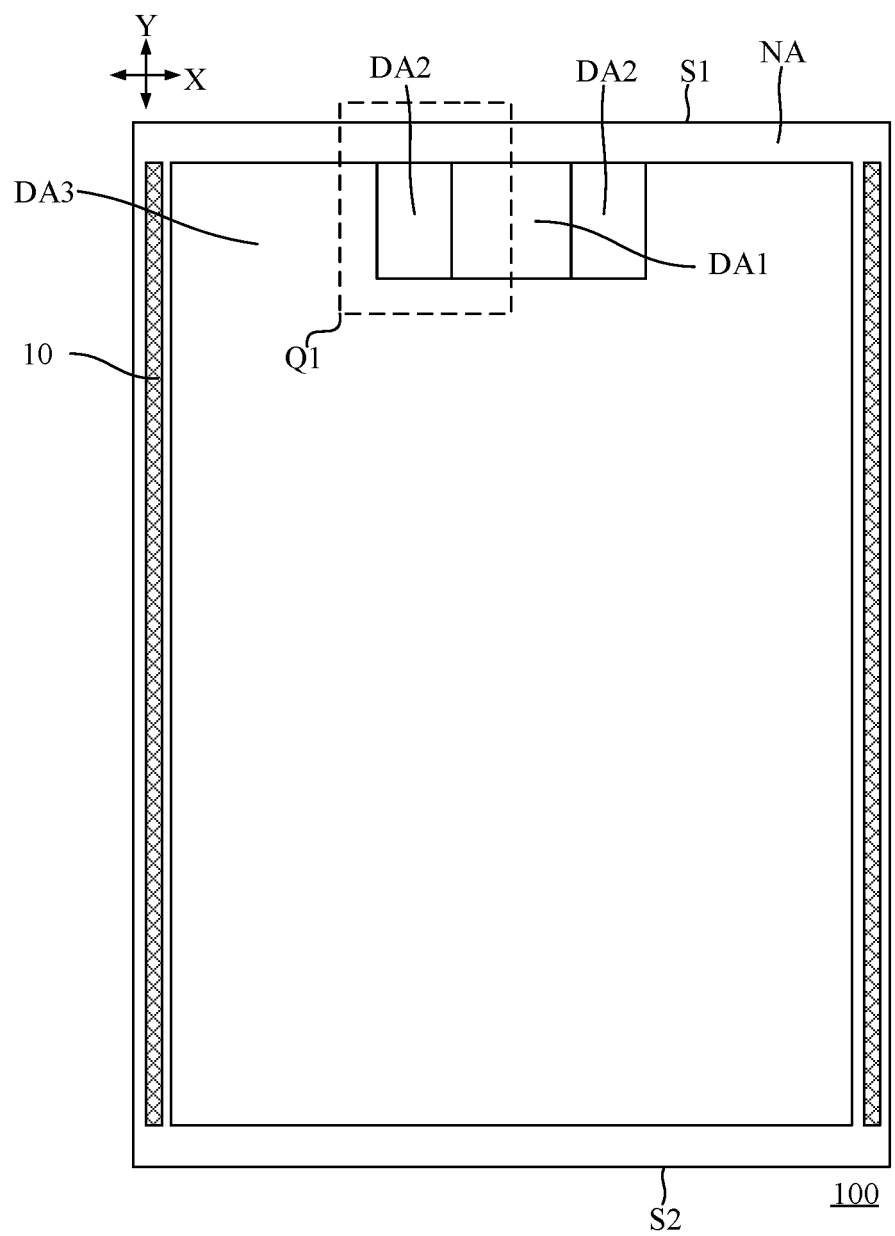
FIG. 1 illustrates a top view of a display panel consistent with various disclosed embodiments of the present disclosure.
Figure 2:
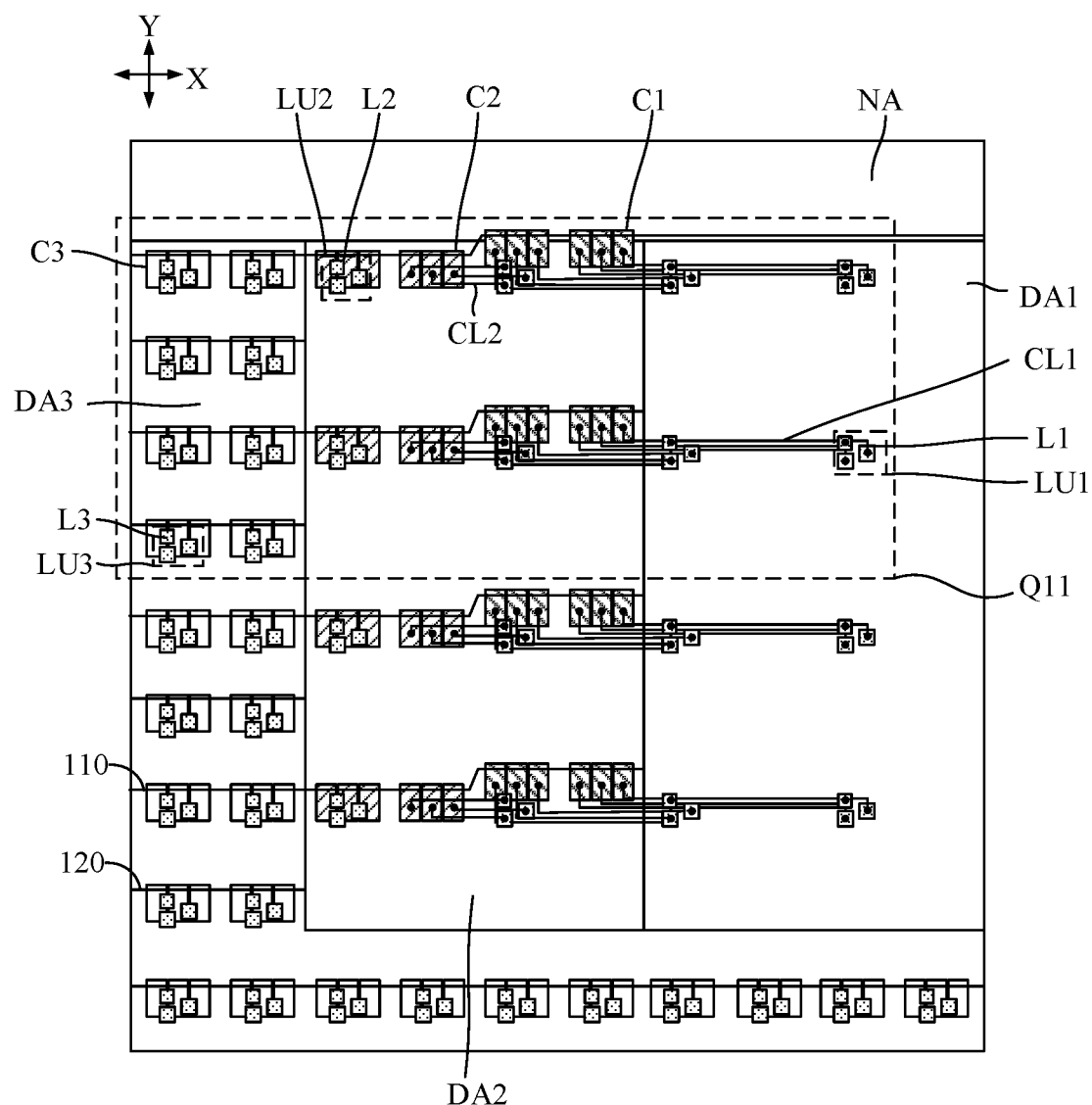
FIG. 2 illustrates an exemplary partially zoomed-in view of Q1-area in FIG. 1.

FIG. 1 illustrates a schematic top view of an exemplary display panel consistent with various disclosed embodiments of the present disclosure. FIG. 2 illustrates a partially zoomed-in view of the Q1-area in FIG. 1. As shown in FIGS. 1-2, the display panel 100 may include a first display area DA1, a second display area DA2, and a third display area DA3. The second display area DA2 may at least partially surround the first display area DA1, and the third display area DA3 may at least partially surround the second display area DA2 and the first display area DA1. The light transmittance of the first display area DA1 may be greater than the light transmittance of the third display area DA3.

The display panel 100 may further include a plurality of first pixel circuits C1, a plurality of second pixel circuits C2, and a plurality of third pixel circuits C3. The plurality of first pixel circuits C1 may be at least partially disposed in the second display area DA2, the plurality of second pixel circuits C2 may be disposed in the second display area DA2, and the plurality of third pixel circuits C3 may be disposed in the third display area DA3.

In one embodiment, the term "pixel circuit" refers to the smallest repeating unit of the circuit structure that drives the corresponding light-emitting element to emit light. The pixel circuit may be a 2T1C circuit, a 7T1C circuit, or a 7T2C circuit, etc. "2T1C circuit" may refer to a pixel circuit that includes 2 thin-film transistors (T) and 1 capacitor (C). Other circuits, such as "7T1C circuits", and "7T2C circuits", etc., may be explained in this manner.

The display panel 100 may further include a plurality of first light-emitting units LU1, a plurality of second light-emitting units LU2, and a plurality of third light-emitting units LU3. The plurality of first light-emitting units LU1 may be arranged in the first display area DA1 as an array, the plurality of second light-emitting units LU2 array may be arranged in the second display area DA2 as an array, and the plurality of third light-emitting unit LU3 may be arranged in the third display area DA3 as an array.

The plurality of first light-emitting units LU1, the plurality of second light-emitting units LU2, and the plurality of third light-emitting units LU3 may be respectively arranged as an array in the corresponding display areas. In particular, the plurality of first light-emitting units LU1, the plurality of second light-emitting units LU2, and the plurality of third light-emitting units LU3 are respectively arranged in the corresponding display areas with multiple rows and multiple columns. The row directions of the plurality of first light-emitting units LU1, the plurality of second light-emitting units LU2, and the plurality of third light-emitting units LU3 may all be parallel to a first direction X, and the column directions of the plurality of first light-emitting units LU1, the plurality of second light-emitting units LU2 and the plurality of third light-emitting units LU3 may all be parallel to a second direction Y. The first direction X and the second direction Y may intersect each other. In one embodiment, the first direction X and the second direction Y may be perpendicular to each other.

A first light-emitting unit LU1 may include at least one first light-emitting element L1, a second light-emitting unit LU2 may include at least one second light-emitting element L2, and a third light-emitting unit LU3 may include at least one third light-emitting element L3. A first pixel circuit C1 may be electrically connected to the at least one first light-emitting element L1, a second pixel circuit C2 may be electrically connected to the at least one second light-emitting element L2, and a third pixel circuit C3 may be electrically connected to the at least one third light-emitting element L3.

In one embodiment, the first light-emitting element L1, the second light-emitting element L2, and the third light-emitting element L3 may be organic light-emitting diode (OLED) light-emitting elements. In particular, the display panel may be an OLED display panel. It can be understood that the display panel of the present disclosure may also be other self-luminous display panel similar to the OLED display panel that may be driven in an Active Matrix (AM) manner.

In one embodiment, the first light-emitting unit LU1 may include three first light-emitting elements L1, and the light-emitting colors of the three first light-emitting elements L1 may be different from each other. In one embodiment, the multiple first light-emitting elements L1 in the first light-emitting unit LU1 may be arranged on the vertices of a virtual triangle. In particular, the multiple first light-emitting elements L1 in the first light-emitting unit LU1 may have a Delta (Δ) structure arrangement. In such an arrangement, each light emitting-element L1 may be rectangular. The arrangements of the light-emitting elements in the second light-emitting unit LU2 and the third light-emitting unit LU3 may be similar to the arrangement of the light-emitting elements in the first light-emitting unit LU1.

It should be noted that the number of light-emitting elements in the first light-emitting unit LU1, the second light-emitting unit LU2, and the third light-emitting unit LU3, the light-emitting color ratio, the shape of the light-emitting elements, and the arrangement of the light-emitting elements are not limited to the above examples. According to actual display panel design requirements, corresponding configuration and adjustment may be made. For example, in some examples, the number of first light-emitting elements L1 in the first light-emitting unit LU1 may be two. In other embodiments, the number of first light-emitting elements L1 in the first light-emitting unit LU1 may be four. In some embodiments, the first light-emitting unit LU1 may include a first light-emitting element L1 that emits red light, a first light-emitting element L1 that emits green light, and a first light-emitting element L1 that emits blue light. In other embodiments, the first light-emitting unit LU1 may include a first light-emitting element L1 that emits red light, a first light-emitting element L1 that emits green light, a first light-emitting element L1 that emits blue light, and a first light-emitting element L1 that emits white light. In some embodiments, the shape of the first light-emitting element L1 in the first light emitting unit LU1 may be circular, or oval, etc. In other examples, the shape of the first light-emitting element L1 in the first light-emitting unit LU1 may be a polygon including square, or hexagon. In some examples, the multiple first light-emitting elements L1 in the first light-emitting unit LU1 may be sequentially arranged along a predetermined direction (in particular, the multiple first light-emitting elements L1 in the first light-emitting unit LU1 may be approximately arranged in the same straight line). In other embodiments, the multiple first light-emitting elements L1 in the first light-emitting unit LU1 may also be arranged in other forms, such as a pentiel structure, etc.

In one embodiment, the configuration that, each first pixel circuit C1 may be correspondingly connected to a first light-emitting element L1, each second pixel circuit C2 may be correspondingly connected to a second light-emitting element L2, and each third pixel circuit C3 may be correspondingly connected to a first light-emitting element L1, is described as an example. However, the correspondence between the first pixel circuit C1 and the first light-emitting element L1, the correspondence between the second pixel circuit C2 and the second light-emitting element L2, and the correspondence between the third pixel circuit C3 and the third light-emitting element L3 may not be limited to this. In some embodiments, each first pixel circuit C1 may be electrically connected to two, three, four, or other numbers of first light emitting elements L1 such that each first pixel circuit C1 can simultaneously drive a corresponding number of first light-emitting elements L1 of the same color to emit light.

In one embodiment, the first pixel circuits C1 may all be disposed outside the first display area DA1. The first pixel circuit C1 may be electrically connected to the first light-emitting element L1 disposed in the first display area DA1 through the first connection line CL1. The first light-emitting element L1 may be disposed in the first display area DA1, and there is no pixel circuit in the first display area DA1. Such a configuration may allow the first display area DA1 to have less circuit structures, and thus the light transmittance may be higher. The first display area DA1 may both display and transmit light to be an integrated area of photosensitive elements. The photosensitive elements may be disposed on the non-display surface side of the first display area DA1.

The second display area DA2 may be disposed with a second pixel circuit C2 for driving the second light-emitting element L2 to emit light, and a first pixel circuit C1 for driving the first light-emitting element L1 to emit light. The second display area DA2 may be light-transmissive or opaque, and its light transmittance may be set according to actual needs. In some optional embodiments, the second display area DA2 may transmit light, and the light transmittance of the second display area DA2 may be lower than the light transmittance of the first display area DA1.

The display panel 100 may further include a plurality of first signal lines 110. The plurality of first signal lines 110 may extend along the first direction X, and may be spaced apart along the second direction Y. Each first signal line 110 may be electrically connected to one or more first pixel circuits C1, one or more second pixel circuits C2, and one or more third pixel circuits C3. In particular, each first signal line 110 may be indirectly connected to one or more first light-emitting elements L1, one or more second light-emitting elements L2, and one or more third light-emitting elements L3. The first light-emitting element L1, the second light-emitting element L2, and the third light-emitting element L3 corresponding to each first signal line 110 may be substantially located on the same row. In particular, the first light-emitting element L1, the second light-emitting element L2, and the third light-emitting element L3 corresponding to each first signal line 110 may be substantially located on the same line extending along the first direction X (passed by the same line extending along the first direction X).

Further, referring to FIG. 2, one or more first pixel circuits C1 and one or more third pixel circuits C3 that are electrically connected to at least a portion (a certain number) of the first signal lines 110 of the plurality of first signal lines 110 may be misaligned along the first direction X. In particular, the one or more first pixel circuits C1 and the one or more third pixel circuits C3 that are electrically connected to the at least portion of the first signal lines 110 may not be aligned along the first direction X. In particular, the first pixel circuits C1 that is electrically connected to the at least portion of the first signal lines 110 may be shifted relative to the third pixel circuits C3 electrically connected to the same first signal line 110 along the second direction Y with a certain distance. FIG. 2 illustrates that the first pixel circuits C1 electrically connected to the first signal line 110 may be shifted with a certain distance upward along the second direction Y relative to the third pixel circuits C3 electrically connected to the same first signal line 110.

Figure 3:
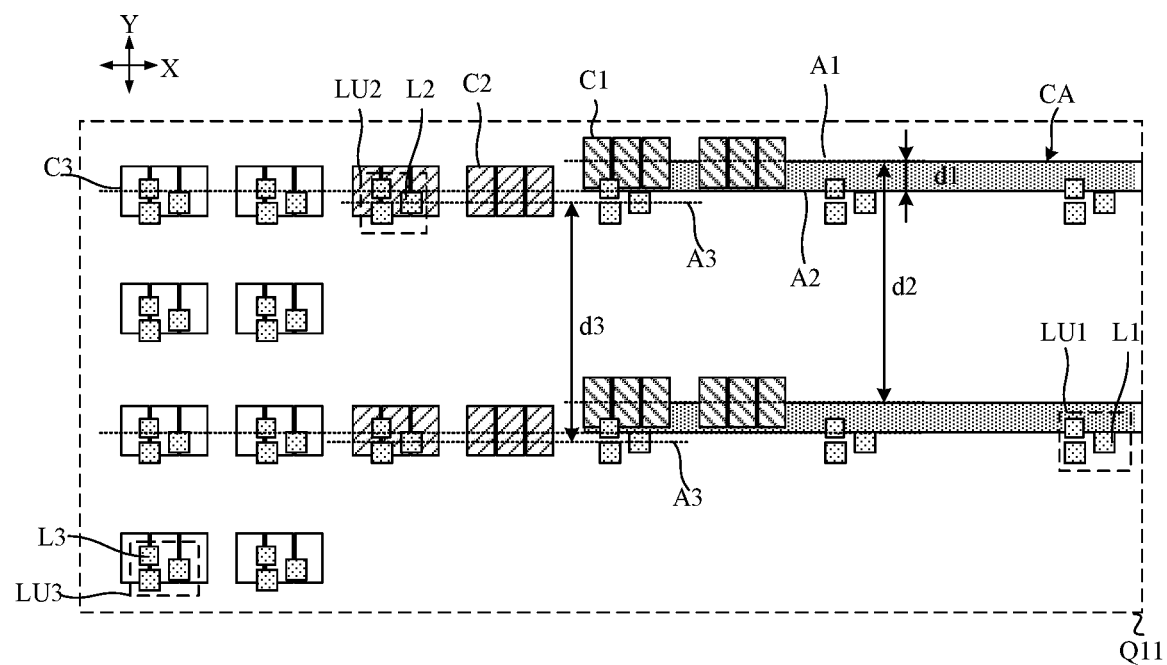
FIG. 3 illustrates an exemplary partially zoomed-in view of Q11-area in FIG. 2.

FIG. 3 illustrates an exemplary partially zoomed-in view of the Q11-area in FIG. 2. As shown in FIG. 3, the first pixel circuits C1 electrically connected to the first signal line 110 may be shifted upward along the second direction Y by a distance d1 relative to the third pixels C3 electrically connected to the same first signal line 110, and the distance between the first pixel circuits C1 and the first light-emitting element L1 electrically connected to the same first signal line 100 along the second direction Y also may also be increased by d1. In particular, the connection space between the first pixel circuits C1 and the first light-emitting element L1 electrically connected to the same first signal line 110 may be increased (as shown in FIG. 3, the connection space is increased by the area CA). Thus, more first connection lines CL1 may be arranged inside the connection space. In particular, more first light-emitting elements L1 may be be arranged in the first display area DA1 with the limited area; and the pixel density of the first display area DA1 may be increased.

It should be understood that the first signal line 110 in such an embodiment may refer to a signal line that is electrically connected to one or more first pixel circuits C1, one or more second pixel circuits C2, and one or more third pixel circuits C3. As shown in FIG. 2, the display panel 100 of the present disclosure may further include second signal lines 120; and a plurality of second signal lines 120 may extend along the first direction X, and may be spaced apart along the second direction Y. Each second signal line 120 may be electrically connected to one or more third pixel circuits C3. In particular, the second signal line 120 may refer to a signal line that is electrically connected to the third pixel circuits C3.

The first signal lines 110 and the second signal lines 120 may be scan lines (Scan line), reference voltage signal lines (Vref line), or optical control signal lines (Emit line), respectively.

In some embodiments, referring to FIG. 2, along the first direction X, all the first pixel circuits C1 electrically connected to the at least portion of the first signal lines 110 among the plurality of first signal lines 110 may be disposed at a side of all the second pixel circuits C2 electrically connected to the signal line 110 adjacent to the side of the first display area DA1. The second pixel circuit C2 may be electrically connected to the corresponding second light-emitting element L2 through a second connection line CL2.

In one embodiment of the present disclosure, by disposing all the first pixel circuits C1 outside the first display area DA1 and adjacent to the first display area DA1, the length of the first connection lines CL1 connecting the first pixel circuits C1 and the first light-emitting elements L1 may be shortened. Thus, the wiring space between the first pixel circuit C1 and the first light-emitting element L1 may be more reasonably used.

Figure 4:
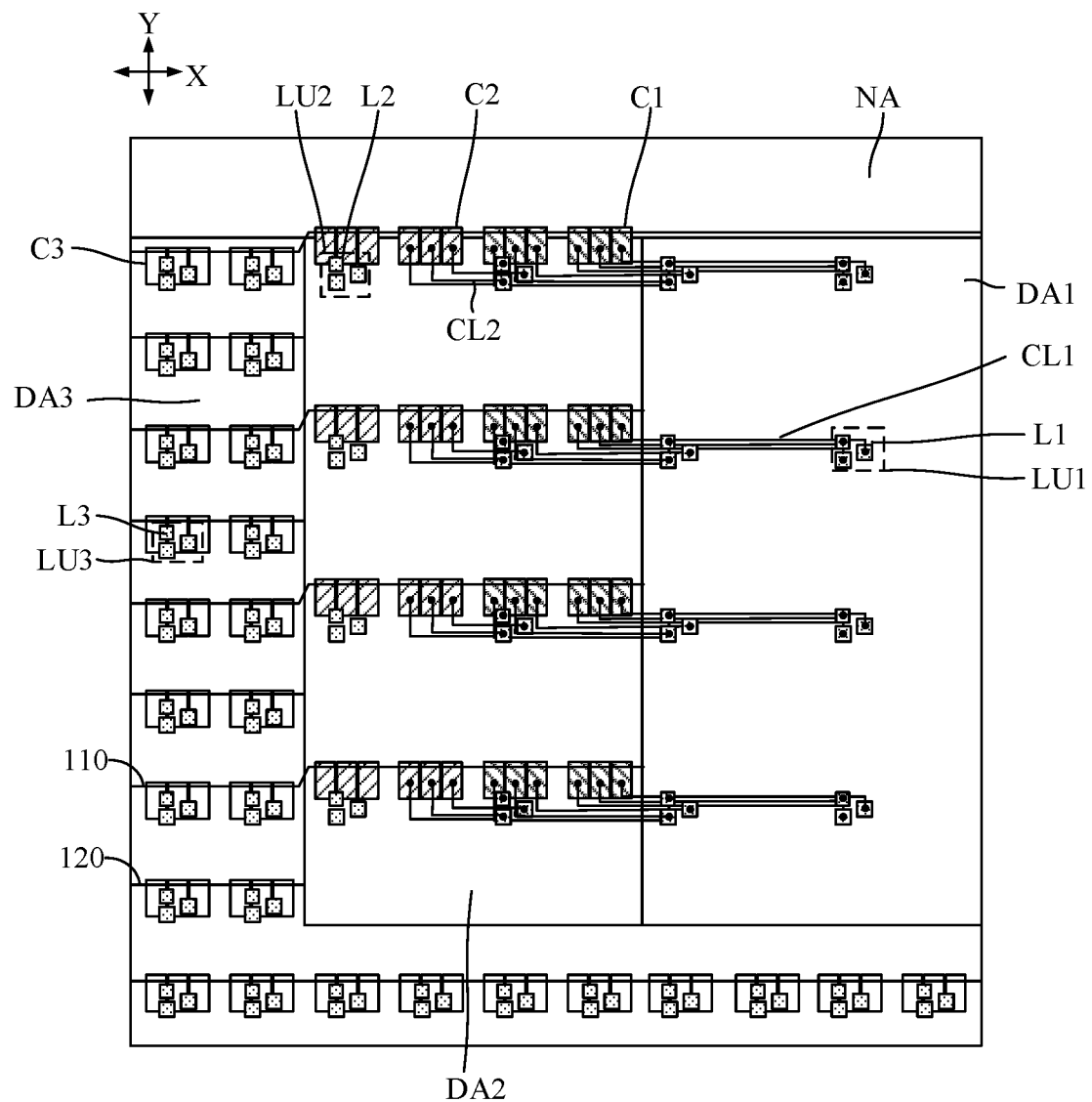
FIG. 4 illustrates another exemplary partially zoomed-in view of Q1-area in FIG. 1.

In the configuration that, relative to the second pixel circuits C2, all the first pixel circuits C1 are disposed adjacent to the first display area DA1, in some embodiments, as shown in FIG. 2, along the first direction X, the second pixel circuits C2 may be aligned with the third pixel circuits C3. In particular, along the second direction Y, the second pixel circuits C2 corresponding to the same first signal line 110 may not be shifted relative to the third pixel circuits C3. In other embodiments, as shown in FIG. 4, along the first direction X, the second pixel circuits C2 may be aligned with the first pixel circuits C1. In particular, along the second direction Y, the second pixel circuits C2 corresponding to the same first signal line 110 may be shifted relative to the third pixel circuit C3.

Figure 5:
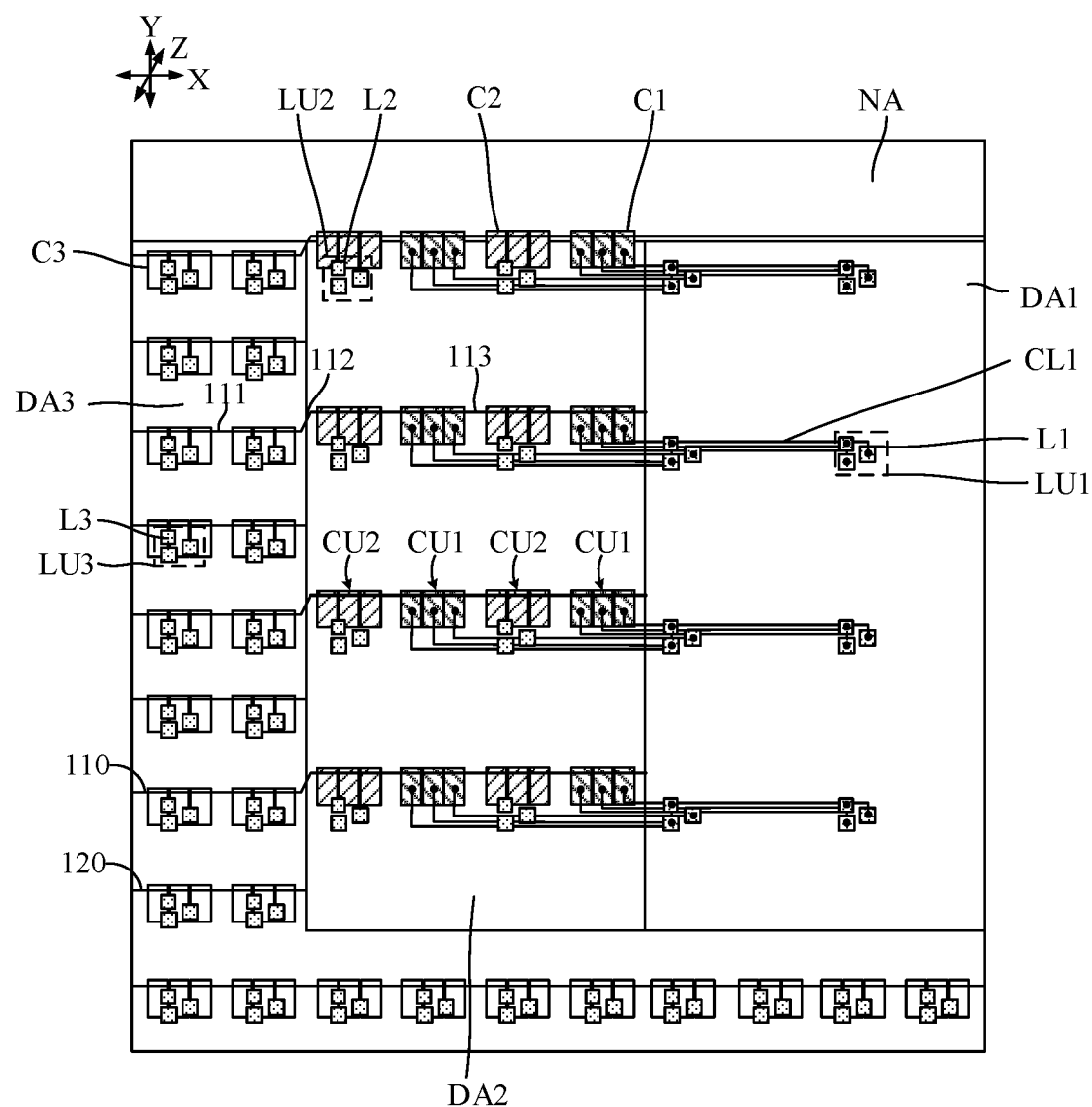
FIG. 5 illustrates another exemplary partially zoomed-in view of Q1-area in FIG. 1.

In some embodiments, as shown in FIG. 5, along the first direction X, the first pixel circuits C1 and the second pixel circuits C2 electrically connected to the same first signal line 110 may be alternately distributed, and the second pixel circuits C2 and the first pixel circuits C1 electrically connected to the same first signal line 110 may be aligned along the first direction X. Arranging the first pixel circuits C1 and the second pixel circuits C2 in an alternately distributed manner may prevent the first connection lines CL1 and the second connection lines CL2 from crossing. Thus, the first connection lines CL1 and the second connection lines CL2 may be disposed on a same wiring layer, and the first connection lines CL1 and the second connection lines CL2 may be simultaneously formed in a same process step. Accordingly, the wiring complexity and the process complexity may be reduced.

Further, as shown in FIG. 5, the display panel 100 may include a first pixel circuit unit CU1 and a second pixel circuit unit CU2. The first pixel circuit unit CU1 may correspond to at least one first light-emitting unit LU1, and the second pixel circuit unit CU2 may correspond to at least one second light-emitting unit LU2. The display panel 100 may further include a third pixel circuit unit CU3, and the third pixel circuit unit CU3 may correspond to at least one third light-emitting unit LU3.

For illustrative purposes, the first pixel circuit unit CU1 may correspond to the first light-emitting unit LU1 one-on-one, and the second pixel circuit unit CU2 may correspond to the second light-emitting unit LU2 one-on-one. Along the first direction X, the first pixel circuits C1 and the second pixel circuits C2 electrically connected to the same first signal line 110 may be alternately distributed, and the first pixel circuit units CU1 and the second pixel circuit unit CU2 electrically connected to the same first signal line 110 may be alternately distributed. In particular, in the second display area DA2, a plurality of pixel units may be arranged in multiple rows and multiple columns. In each row of pixel units, the first pixel circuit units CU1 and the second pixel circuit units CU2 may be alternately arranged along the first direction X. In each column of pixel units, multiple first pixel circuit units CU1 may be sequentially arranged along the second direction Y, and multiple second pixel circuit units CU2 may be sequentially arranged along the second direction Y.

Figure 6:
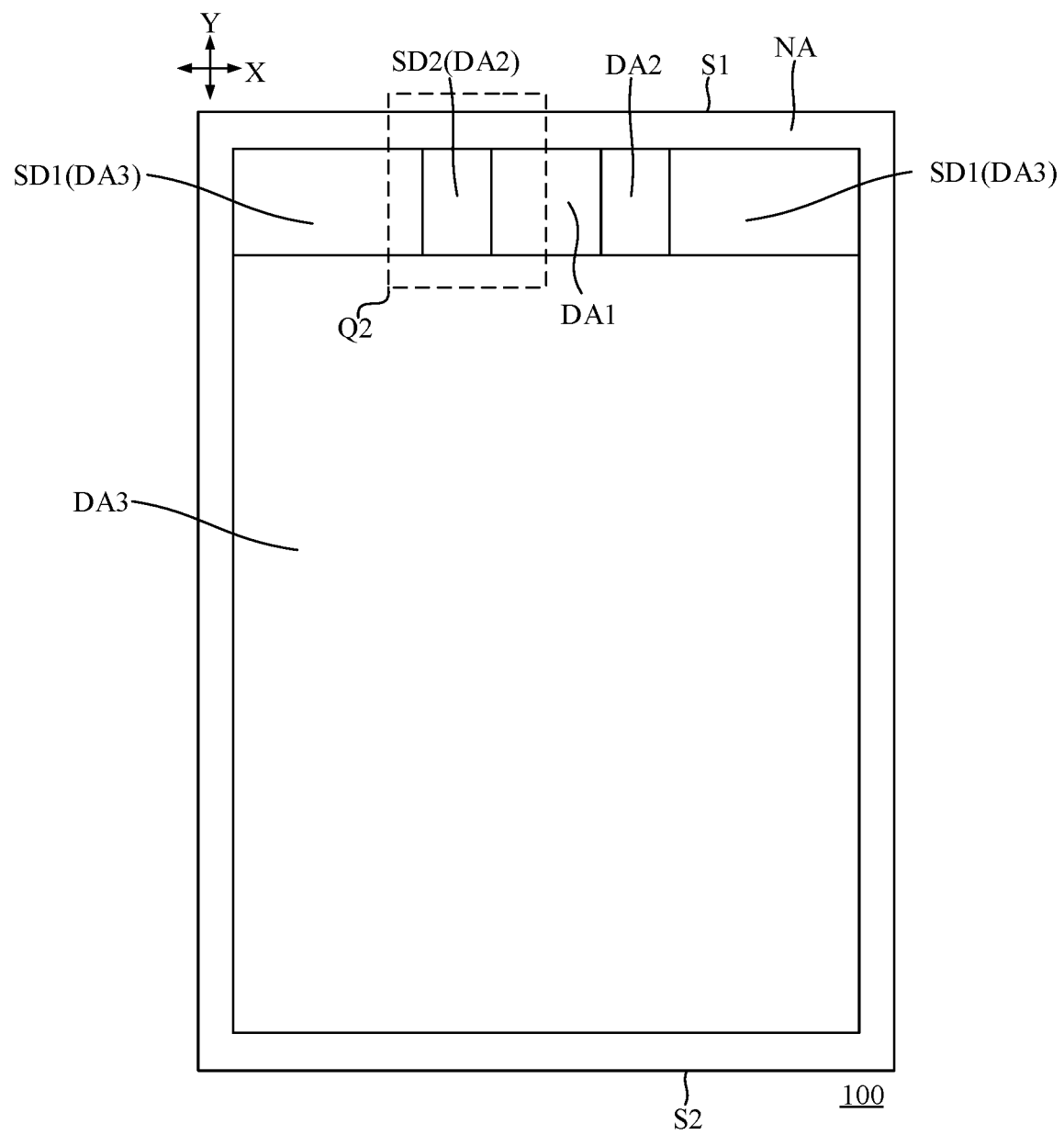
FIG. 6 illustrates a top view of another exemplary display panel consistent with various disclosed embodiments of the present disclosure.
Figure 7:
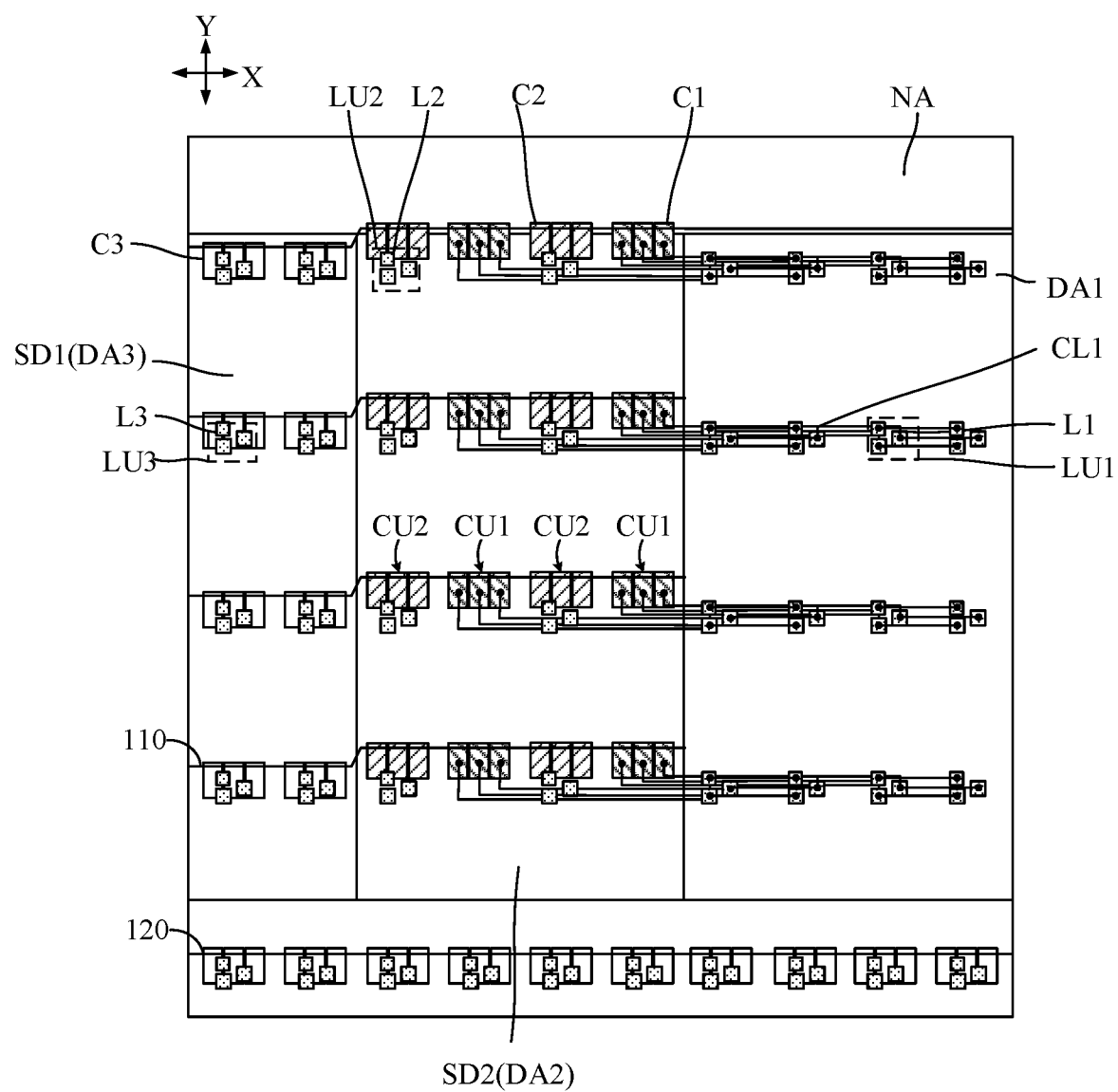
FIG. 7 illustrates an exemplary partially zoomed-in view of Q2-area in FIG. 6.

FIG. 6 illustrates a top view of another exemplary display panel consistent with various disclosed embodiments of the present disclosure. FIG. 7 shows a partially zoomed-in view of the Q2-area in FIG. 6. As shown in FIGS. 6-7, the third display area DA3 may include a first sub-display area SD1. Along the first direction X, the first sub-display area SD1 may be disposed on at least one side of the second display area DA2. The second display area DA2 may include a second sub-display area SD2. Along the first direction X, the second sub-display area SD2 may be disposed on at least one side of the first display area DA1. The length of the first sub-display area SD1 along the second direction Y, the length of the second sub-display area SD2 along the second direction Y and the length of the first display area DA1 along the second direction Y may be equal.

In the first display area DA1, the plurality of first light-emitting units LU1 may be arranged in n1 rows×m1 columns along the first direction X and the second direction Y. m1 and n1 may both be integers greater than 1. In the second sub-display area SD2, the plurality of second light-emitting units LU2 may be arranged in n2 rows×m2 columns along the first direction X and the second direction Y. m2 and n2 may both be integers greater than 1. In the first sub-display area SD1, the plurality of third light-emitting units LU3 may be arranged in n3 rows×m3 columns along the first direction X and the second direction Y. m3 and n3 may both be integers greater than 1. In one embodiment, n1, n2 and n3 may be equal. In the first display area DA1, the plurality of first light-emitting units LU1 may be aligned along the first direction X and the second direction Y, and in the second sub-display area SD2, the plurality of second light-emitting units LU2 may be aligned along the first direction X and the second direction Y.

In particular, the number of rows of light-emitting units disposed in the first display area DA1, the first sub-display area SD1, and the second sub-display area SD2 may be equal. In addition, the number of columns of light-emitting units in the first display area DA1, the first sub-display area SD1, and the second sub-display area SD2 may be set according to actual requirements, and is not limited in the present disclosure. In one embodiment of the present disclosure, the number of rows of light-emitting units relative to the first display area DA1 or the first sub-display area SD1 may be less than the number of rows of light-emitting units in the second sub-display area SD2. Thus, more light-emitting units may be disposed in the first sub-display area SD1; and the pixel density of the first display area DA1 or the first sub-display area SD1 may be increased.

Further, referring to FIG. 7, the first pixel circuit C1 may be electrically connected to at least two first light-emitting elements L1 through first connection lines CL1. FIG. 7 exemplarily shows that the first pixel circuit C1 is electrically connected to two first light-emitting elements L1. By arranging the first pixel circuit C1 to correspondingly electrically connect to multiple first light-emitting elements L1, on the one hand, the number of first pixel circuits C1 may be reduced, and on the other hand, more first light-emitting units may be disposed in the first display area DA1. Thus, the pixel density of the first display area DA1 may be increased.

In some embodiments, the colors of the first light-emitting elements L1 electrically connected to the same first connection line CL1 may be same. Thus, one first pixel circuit C1 can be used to control multiple first light-emitting elements L1 with the same color to facilitate the display control. Further, the first light-emitting elements L1 electrically connected to the same first connection line CL1 may be adjacent to each other along the first direction X. Thus, the wiring length of the first connection lines CL1 may be reduced, and different first connection lines CL1 may be prevented from crossing each other.

In other embodiments, at least the first connection lines CL1 disposed in the first display area DA1 may be transparent conductive wires. Thus, the light transmittance of the first display area DA1 may be increased. The first connection lines CL1 disposed in the first display area DA1 may be a light-transmitting conductive material, such as indium tin oxide (ITO), or indium zinc oxide (IZO). In one embodiment, the first connection line CL1 disposed in the second display area DA2 may be a metal wire, and thus the resistance of the first connection line CL1 may be reduced.

Figure 8:
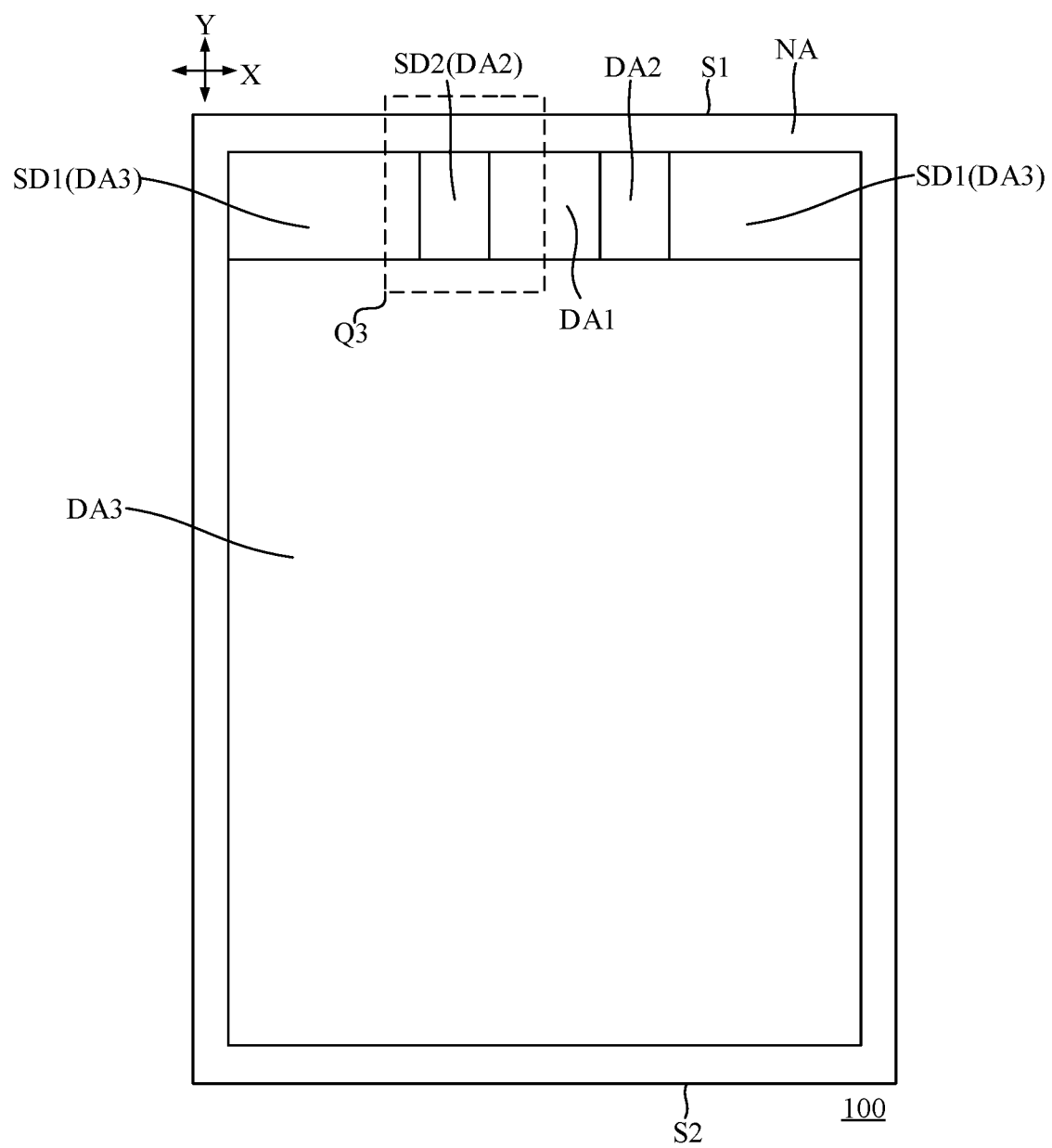
FIG. 8 illustrates a top view of another exemplary display panel consistent with various disclosed embodiments of the present disclosure.
Figure 9:
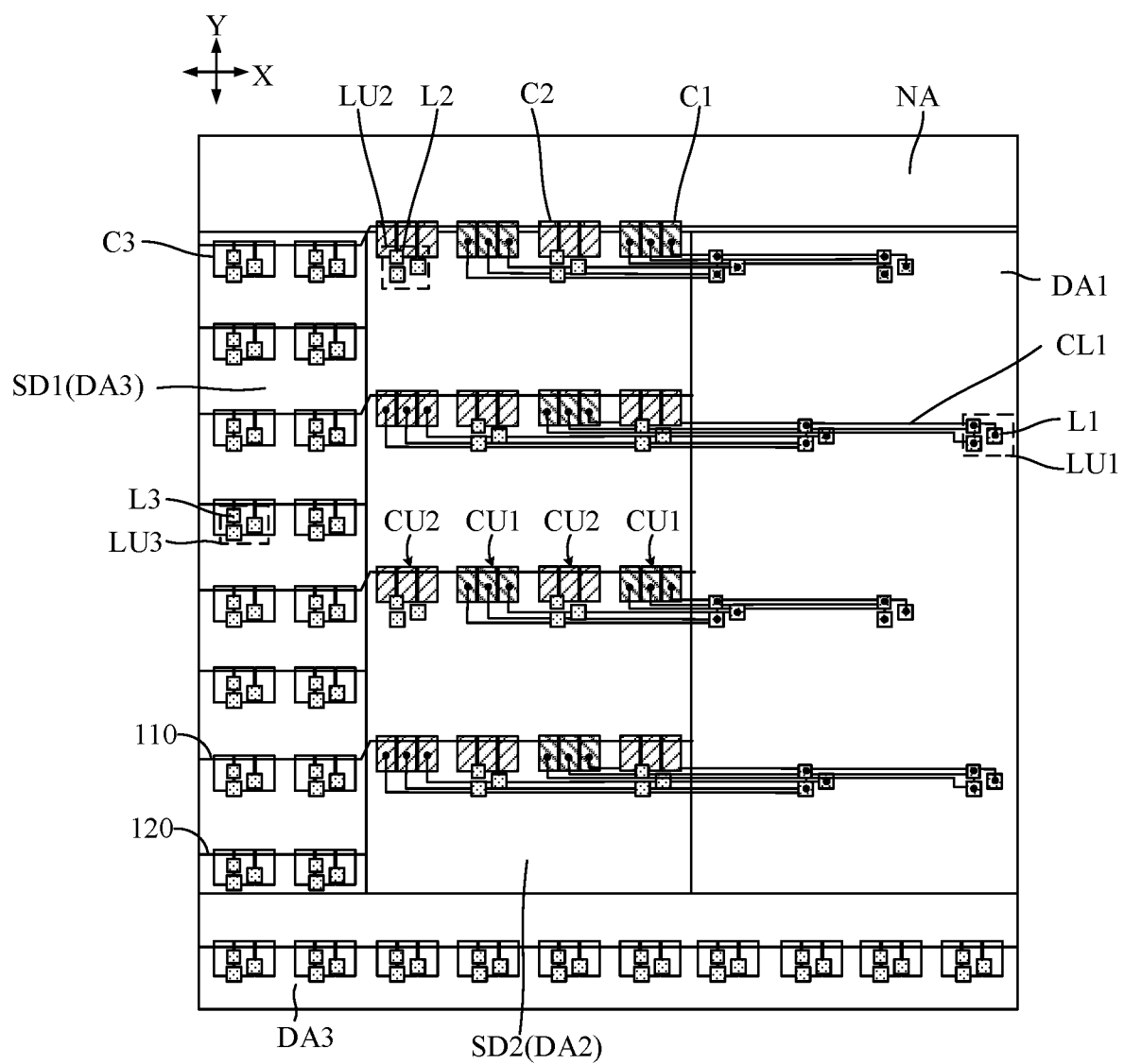
FIG. 9 illustrates an exemplary partially zoomed-in view of Q3-area in FIG. 8.

FIG. 8 illustrates a top view of an exemplary display panel consistent with various disclosed embodiments of the present disclosure. FIG. 9 illustrates a partially zoomed-in view of the Q3-area in FIG. 8. As shown in FIGS. 8-9, the third display area DA3 may include a first sub-display area SD1. Along the first direction X, the first sub-display area SD1 may be located on at least one side of the second display area DA2. The second display area DA2 may include a second sub-display area SD2. Along the first direction X, the second sub-display area SD2 may be located on at least one side of the first display area DA1. The length of the first sub-display area SD1 along the second direction Y, the length of the second sub-display area SD2 along the second direction Y and the length of the first display area DA1 along the second direction Y may be equal.

In the first display area DA1, the plurality of first light-emitting units LU1 may be arranged in n1 rows×m1 columns along the first direction X and the second direction Y. m1 and n1 may be integers greater than 1. In the second sub-display area SD2, the plurality of second light-emitting units LU2 may be arranged in n2 rows×m2 columns along the first direction X and the second direction Y. m2 and n2 may both be integers greater than 1. In the first sub-display area SD1, the plurality of third light-emitting units LU3 may be arranged in n3 rows×m3 columns along the first direction X and the second direction Y. m3 and n3 may both be integers greater than 1. In one embodiment, n1 may be equal to n2, and n2 may be smaller than n3. The plurality of first light-emitting units LU1 may be alternately arranged along the first direction X and the second direction Y, and the plurality of second light-emitting units LU2 may be alternately arranged along the first direction X and the second direction Y.

In particular, the number of rows of light-emitting units in the first display area DA1 and the second sub-display area SD2 may be smaller than the number of rows of light-emitting units in the first sub-display area SD1. In addition, the number of columns of light-emitting units in the first display area DA1, the first sub-display area SD1, and the second sub-display area SD2 may be set according to actual requirements, and is not limited in the present disclosure application. In one embodiment of the present disclosure, when the number of rows of light-emitting units in the first display area DA1 and the second sub-display area SD2 may be less than the number of rows of light-emitting units in the first sub-display area SD1, because the plurality of first light-emitting units LU1 and the plurality of second light-emitting units LU2 may all be alternately arranged along the first direction X and the second direction Y, the plurality of first light-emitting units LU1 and the plurality of second light-emitting units LU2 may be more evenly arranged in the first direction X and the second direction Y to avoid the bright or dark line defects of the display panel 100 caused by light-emitting units being aligned along the first direction X and the second direction Y, and the low pixel density. Thus, the display effect of the display panel 100 may be improved when the pixel density is low.

Further, referring to FIG. 3, to clearly show the central axis, FIG. 3 shows hidden drawing of the first connection line CL1, the second connection line CL2, the first signal line 110, and the boundary lines of each display area and non-display area. As shown in FIG. 3, the first pixel circuits C1 electrically connected to the same first signal line 110 may be aligned and distributed along the first direction X, and may have a first central axis A1 along the first direction X. The second pixel circuits C2 electrically connected to the same first signal line 110 may be aligned and distributed along the first direction X, and may be have a second central axis A2 along the first direction X. The first central axis A1 and the second central axis A2 corresponding to the same first signal line 110 may have a first vertical distance d1 along the second direction Y. The first vertical distance d1 may be the shifted distance of the first pixel circuit C1. All first vertical distances d1 may be equal to each other. FIG. 3 only shows that the first pixel circuits C1 electrically connected to the same first signal line 110 may be shifted upward along the second direction Y relative to the third pixel circuit C3. In some embodiments, the first pixel circuits C1 electrically connected to the same first signal line 110 may be shifted downward along the second direction Y relative to the third pixel circuit C3. The first vertical distances d1 in the present disclosure may be equal. It can be understood that the shifted distances of the first pixel circuits C1 in multiple rows may be same. In particular, the increased wiring distances of the first pixel circuits C1 and the first light-emitting elements L1 corresponding to each first signal line 110 along the second direction Y may also be equal. Accordingly, the first connection lines CL1 corresponding to the first light-emitting units LU1 in each row may be uniformly arranged.

In some embodiments, referring to FIGS. 1-3 in a combination, along the second direction Y, the display panel 100 may have a first edge S1 and a second edge S2 opposite to each other. In particular, the first central axis A1 corresponding to the same first signal line 110 may be located at the side of the second central axis A2 adjacent to the first edge S1, and along the direction away from the first edge S1, the first vertical distance d1 may gradually decrease. In particular, the first pixel circuits C1 electrically connected to each first signal line 110 may be shifted upward in the second direction Y relative to the third pixel circuits C3, and the shifted distances may be gradually decreased along the direction away from the first edge S1.

Figure 10:
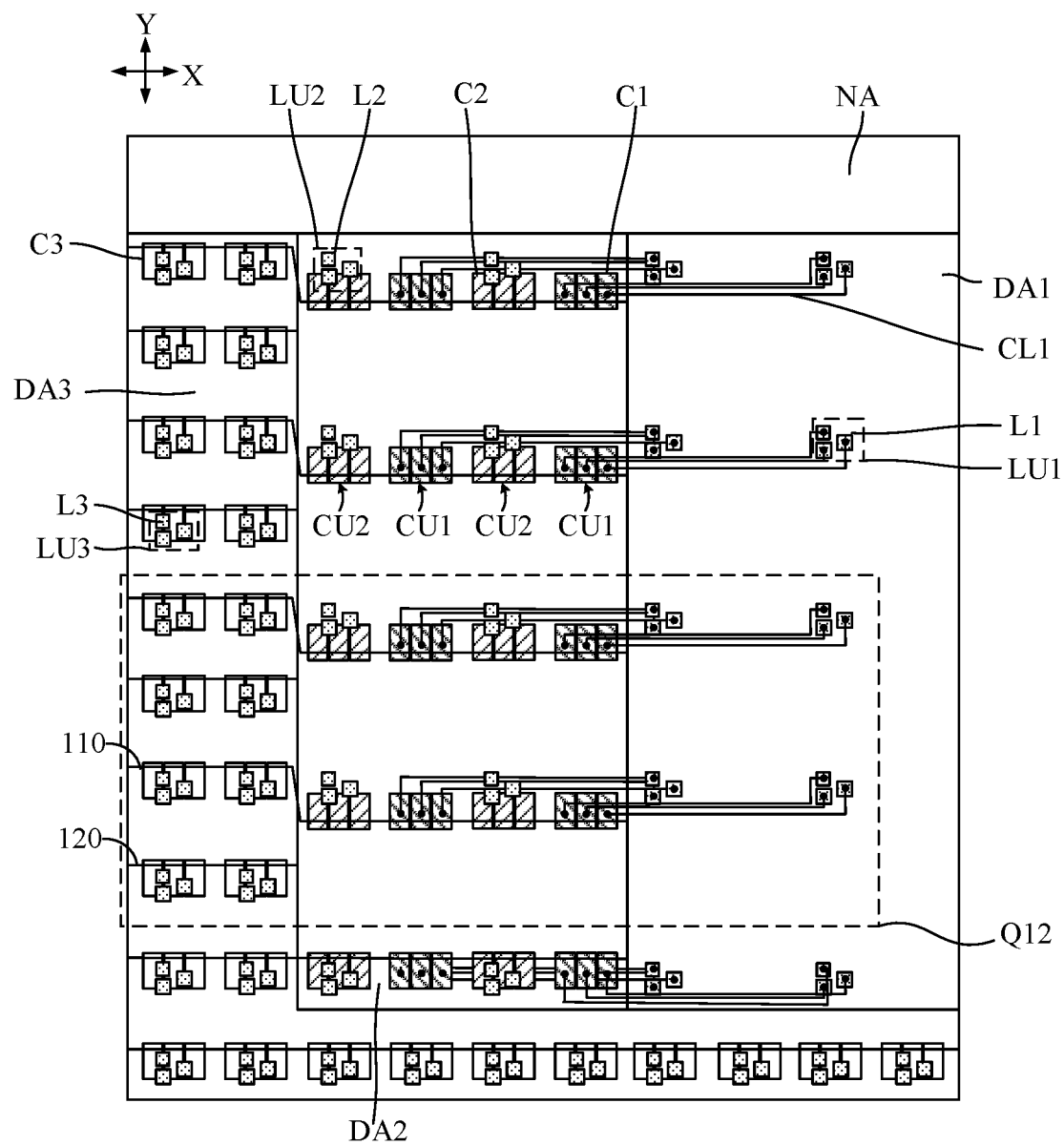
FIG. 10 illustrates another exemplary partially zoomed-in view of Q1-area in FIG. 1.
Figure 11:
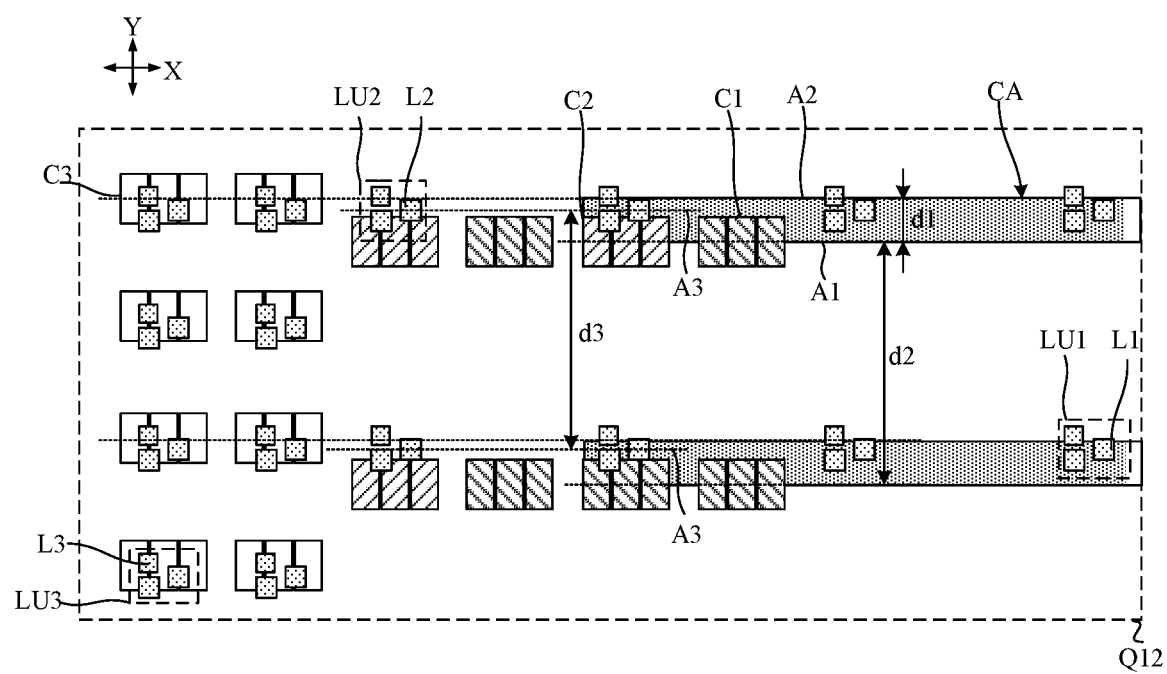
FIG. 11 illustrates another exemplary partially zoomed-in view of Q12-area in FIG. 10.

FIG. 10 illustrate a partially zoomed-in view of another exemplary Q1-area in FIG. 1. FIG. 11 illustrates a partially zoomed-in view of another exemplary Q12-area in FIG. 10. To clearly show the central axis, FIG. 11 shows hidden drawings of the first connection line CL1, the second connection line CL2, the first signal line 110, and the boundary lines of each display area and non-display area. In some embodiments, referring to FIG. 1, FIG. 10, and FIG. 11 in combination, the first central axis A1 corresponding to the same first signal line 110 may be located on the side of the second central axis A2 adjacent to the second edge S2. Along the direction away from the second edge S2, the first vertical distances d1 may gradually decrease. In particular, the first pixel circuit C1 electrically connected to each first signal line 110 may be shifted downward along the second direction Y relative to the third pixel circuit C3, and the shifted distance be gradually decreased along the direction away from the second edge S2.

Comparing with the configuration that the first pixel circuits C1 in different rows are moved by the same distance, the current configuration may increase the distance of the first pixel circuits C1 in two adjacent rows along the second direction Y. Thus, the wiring space of the connection lines CL1 between the first pixel circuits C1 in two adjacent rows; more first connection lines CL1 may be arranged in the wiring space. In particular, more first light-emitting elements L1 may be disposed in the limited first display area DA1. Thus, the pixel density of the first display area DA1 may be increased.

Further, as shown in FIG. 10, there may be four rows of first pixel circuits C1 in the second display area DA2, and the last row of first pixel circuits C1 may be adjacent to the third pixel circuit C3 along the second direction Y. Thus, the last row of first pixel circuits C1 may have no room to move down along the second direction Y. The first pixel circuits C1 in the last row may be aligned with the third pixel circuits C3 on the same first signal line 110 along the first direction X. In particular, the first pixel circuit C1 in the last row may not be shifted.

Further, as shown in FIG. 3 or FIG. 11, each of two adjacent first central axes A1 may have a second vertical distance d2 along the second direction Y, and at least a portion of the second vertical distances d2 may be equal. According to such a configuration, the increased distances between at least a portion of the first pixel circuits C1 in adjacent rows may be equal. Thus, the first connection lines CL1 corresponding to the first light-emitting units LU1 in each row may be uniformly arranged.

In some embodiments, to prevent the second connection lines CL2 and the first connection lines CL1 corresponding to the second light-emitting units LU2 in different rows from crossing each other, the shifted distance of the first pixel circuit C1 may be limited. For illustrative purposes, as shown in FIG. 3 or FIG. 11, the second light-emitting units LU2 electrically connected to the same first signal line 110 may be aligned along the first direction X, and may have a third central axis A3 along the first direction X. Each two adjacent third central axes A3 may have a third vertical distance d3 along the second direction Y. The first vertical distance d1 may be smaller than the third vertical distance d3.

In one embodiment, the first vertical distance d1 may be ½ of the third vertical distance d3. In such a configuration, it may only be necessary to shift the first pixel circuit C1 up or down by one half of the pitch of the second light-emitting units LU2 along the second direction Y in the adjacent rows, and the increase in the wiring space of the first connection line CL1 may be better achieved. Accordingly, more first light emitting-elements L1 may be disposed in the limited first display area DA1, and the pixel density of the first display area DA1 may be increased.

Further, according to a large amount of experimental data, setting the first vertical distance d1 to be less than or equal to 200 microns may better achieve the purpose of increasing the wiring space, and more first light-emitting elements L1 may be disposed in the limited first display area DA1. Thus, the pixel density of the first display area DA1 may be increased.

Figure 12:
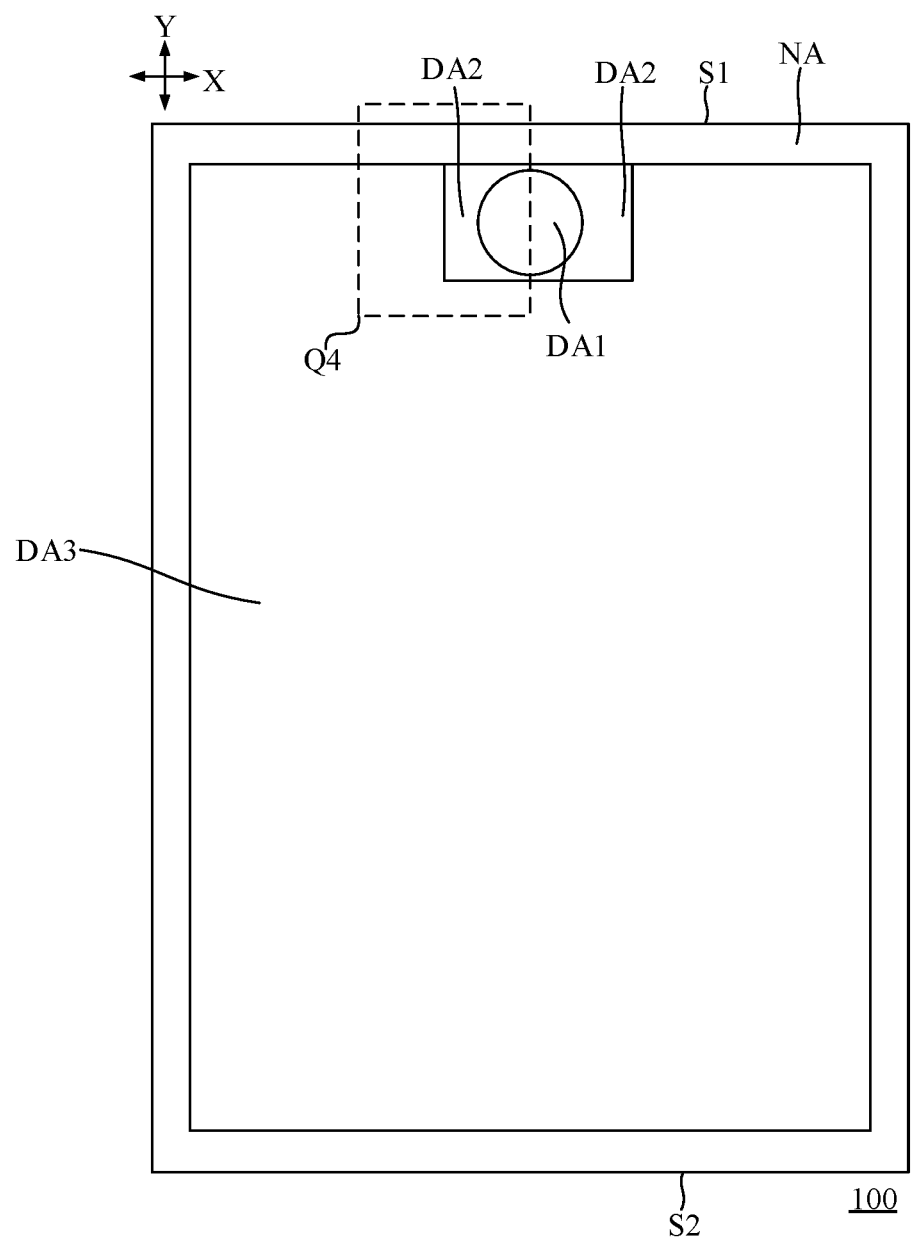
FIG. 12 illustrates a top view of another exemplary display panel consistent with various disclosed embodiments of the present disclosure.
Figure 13:
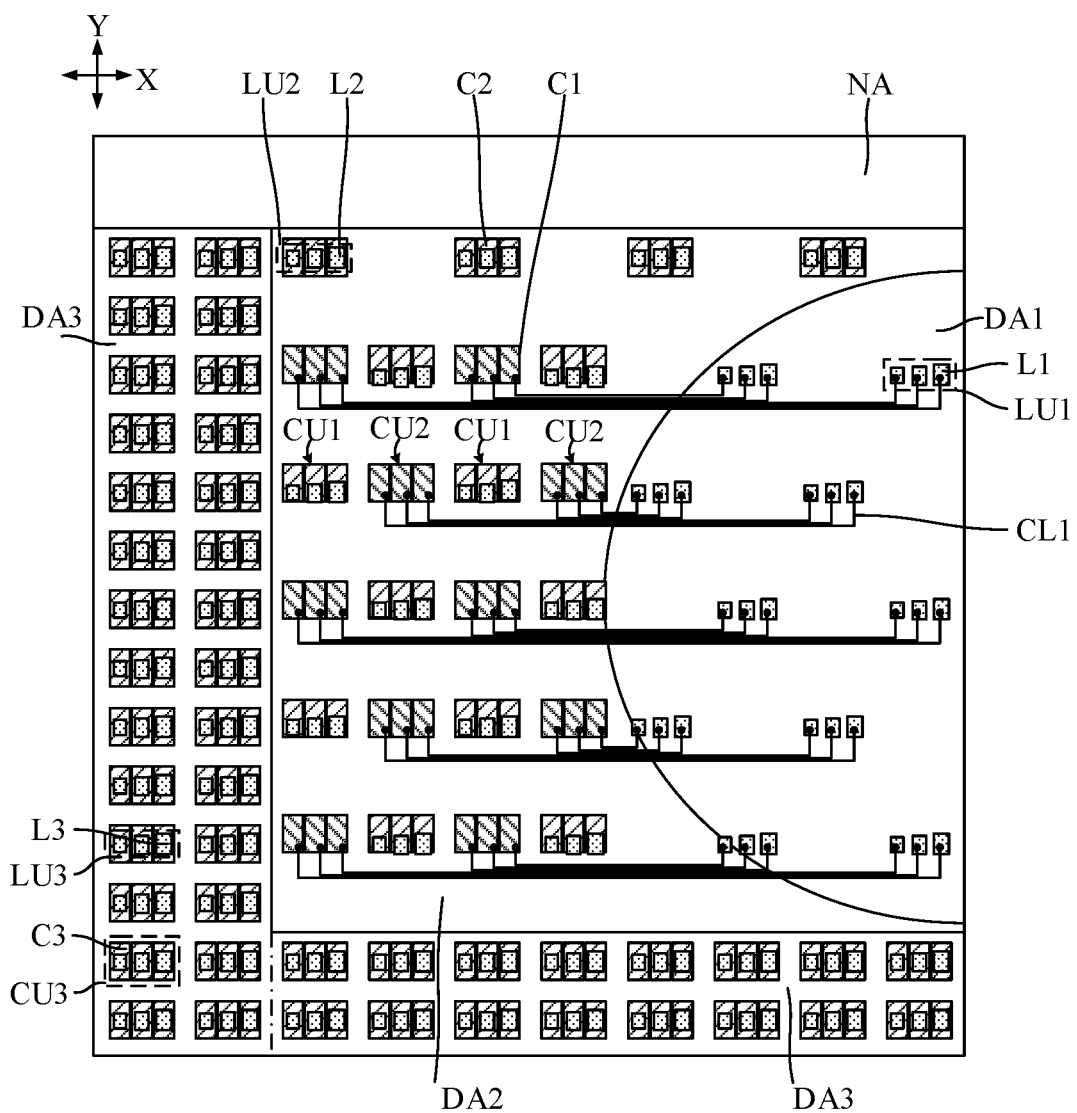
FIG. 13 illustrates an exemplary partially zoomed-in view of Q4-area in FIG. 12.

FIG. 12 illustrates another exemplary display panel consistent with various disclosed embodiments of the present disclosure. FIG. 13 shows an exemplary partially zoomed-in view of the Q4-area in FIG. 12. As shown in FIGS. 12-13, the first display area DA1 may be a circular area. It can be understood that, along the second direction Y and the direction adjacent to the center of the first display area DA1, the number of the first light-emitting units LU1 corresponding to each first signal line 110 may gradually increase. The first pixel circuits C1 may be arranged outside the first display area DA1. In particular, along the second direction Y and the direction adjacent to the center of the first display area DA1, the number of the first pixel circuits C1 corresponds to each first signal line 110 and needed to be disposed externally may also gradually increase. Thus, the number of first connection lines CL1 corresponding to the first light-emitting unit LU1 in each row may also gradually increase.

In one embodiment, the number of the first signal lines may be N, and N may be an integer greater than 1. When N is an odd number, along the direction from the i-th first signal line 110 to the first edge S1 and the direction from the i-th first signal line 110 to the second edge S2, the vertical distances d1 may all be gradually decreased. i=(N+1)/2. In the case where N is an even number, along the direction from the i-th first signal line 110 to the first edge S1 and the direction from the (i+1)-th first signal line 110 approaching the second edge S2, the first vertical distances d1 may also be gradually decreased. The first vertical distance d1 corresponding to the i-th first signal line 110 and the first vertical distance d1 corresponding to the (i+1)-th first signal line 110 may be equal to each other. i=N/2. In particular, along the second direction Y, the shifted distance of the first pixel circuit C1 located in the middle area may be greater than the shifted distance of the first pixel circuit C1 located in the edge area. Thus, under the condition that when the number of first connecting lines CL1 corresponding to each row of the first light-emitting units LU1 in the middle area is relatively large, there may also be enough space to place these first connection lines CL1.

Further, as shown in FIG. 13, the multiple first connection lines CL1 corresponding to the first light-emitting unit LU1 in the same row may not overlap each other. In such a configuration, the plurality of first connection lines CL1 may be disposed in the same wiring layer of the display panel 100.

In some embodiments, refer to FIGS. 1-2, along the second direction Y, the display panel 100 may have a first edge S1 and a second edge S2 opposite to each other. The display panel 100 may also include a non-display area NA. The non-display area NA may at least partially surround the first display area DA1, the second display area DA2, and the third display area DA3. In the second direction Y, the non-display area NA may be spaced between the second display area DA2 and the first edge S1, and the third display area DA3 and a non-display area NA may be spaced between the second display area DA2 and the second edge S2. In particular, the first display area DA1 and the second display area DA2 may be set to be adjacent to the non-display area NA, and further, the first pixel circuits C1 electrically connected to the first signal line 110 adjacent to the first edge S1 may be at least partially disposed in the non-display area NA. That is, in one embodiment of the present disclosure, the first pixel circuits C1 electrically connected to each first signal line 110 may all be shifted upward relative to the third pixel circuits C3 electrically connected to the first signal line 110. In such a configuration, each row of first pixel circuits C1 may have a larger shifted space. Thus, the wiring space between the first pixel circuits C1 and the first light-emitting units LU1 may be increased to achieve a higher pixel density in the first display area DA1.

In some embodiments, referring to FIG. 5, a first signal line 110 may include a first segment 111, a connection segment 112, and a second segment 113 that are electrically connected to each other. The first segment 111 may be located in the third display area DA1, and may extend along the first direction X. The second segment 113 may be located in the second display area DA2, and may extend along the first direction X. The connection segment 112 may be connected between the first segment 111 and the second segment 113, and may extend along the third direction Z. The third direction Z may intersect both the first direction X and the second direction Y. In one embodiment of the present disclosure, the connection segment 112 may be extended obliquely to connect the first segment 111 and the second segment 113, and the wiring method may be simple and easy. The connection segment 112 may also be arranged to extend along the second direction Y, or the first pixel circuit C1 and the second pixel circuit C2 may be arranged adjacent to the first display area DA1 as a whole. Thus, there may be enough space between the second pixel circuit C2 and the adjacent third pixel circuit C3 to dispose the connection segment 112.

In one embodiment, the display panel may include a first metal layer and a second metal layer that are stacked and insulated. The first signal lines 110 may include a scan line, a reference voltage signal line, and a light control signal line. The scan line and the light control signal line may be arranged on the first metal layer, and the reference voltage signal line may be be arranged on the second metal layer. The metal layer where the signal lines are located may also be set according to actual needs, and is not limited in the present disclosure.

Figure 14:
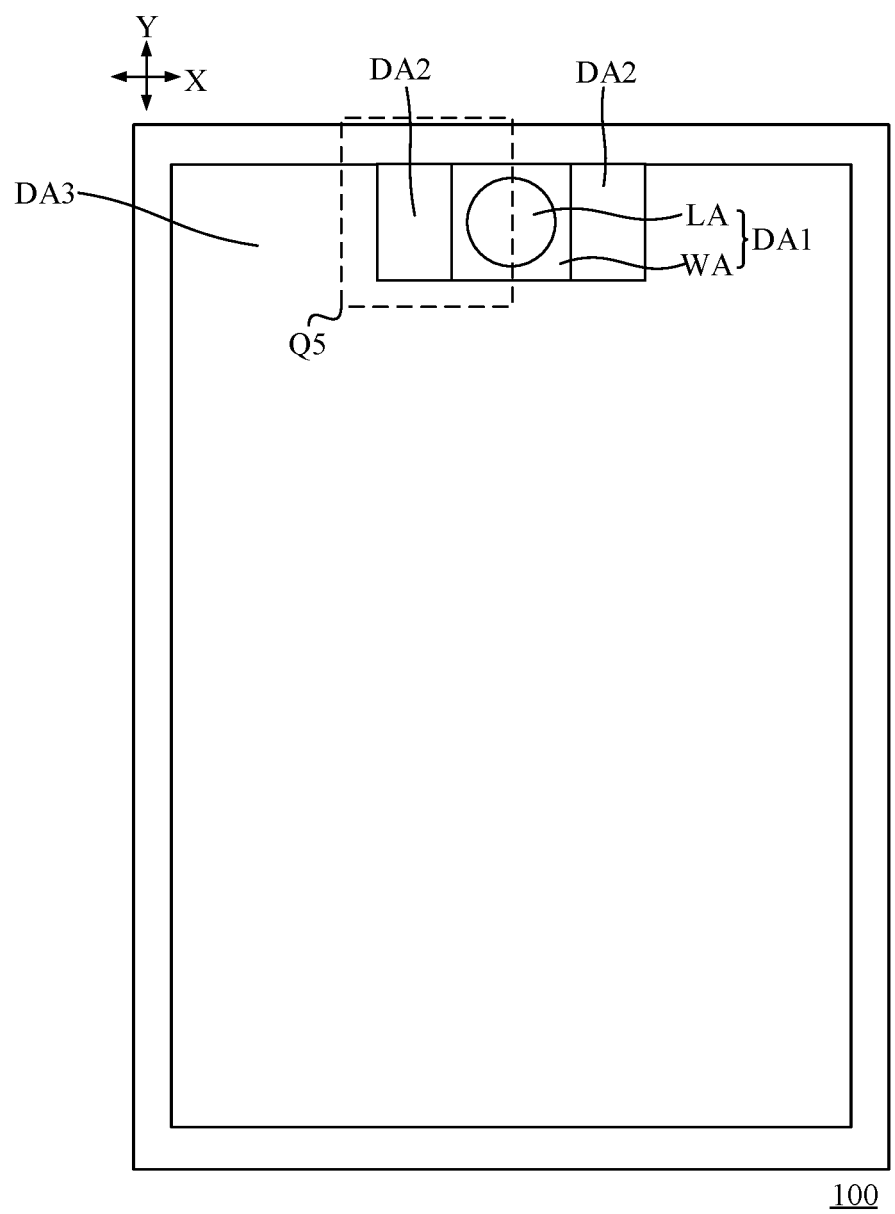
FIG. 14 illustrates a top view of another exemplary display panel consistent with various disclosed embodiments of the present disclosure.
Figure 15:
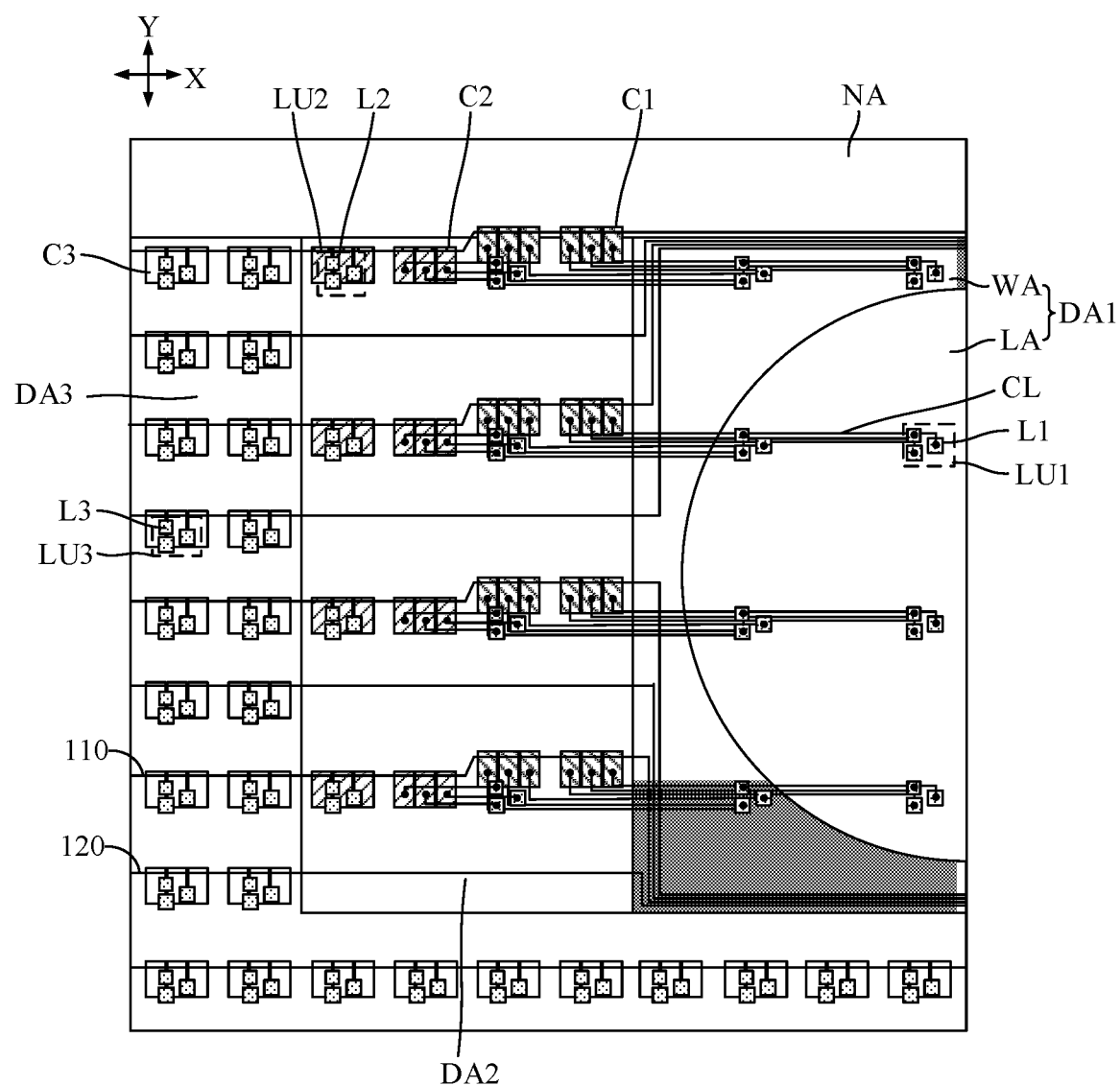
FIG. 15 illustrates an exemplary partially zoomed-in view of Q5-area in FIG. 14.

FIG. 14 shows a top view of another exemplary display panel consistent with various disclosed embodiment of the present disclosure. FIG. 15 shows an exemplary partially zoomed-in view of the Q5-area in FIG. 14. As shown in FIGS. 14-15, in some embodiments, the first display area DA1 may include an effective light-transmission area LA and a wiring area WA located on the peripheral side of the effective light-transmission area LA. It should be noted that in the first display area DA1, the wiring area WA may be located on the peripheral side of the effective light-transmission area LA, and the second display area DA2 may at least partially surround the first display area DA1, and the third display area DA3 may at least partially surround the second display area DA2 and the first display area DA1. The shapes of the first display area DA1 and the wiring area WA may be regular or irregular, such as a combined shape obtained by combining regular shapes. In some embodiments, the second display area DA2 may be arranged to partially surround the first display area DA1 such that a portion of the first display area DA1 may be surrounded by the second display area DA2. The first display area DA1 may also include the portion not surrounded by the second display area DA2.

The first pixel circuit C1 and the first signal line 110 may be both arranged outside the effective light-transmission area LA to reduce the wiring structure in the effective light-transmission area LA to increase the light transmittance of the effective light-transmission area LA. When the photosensitive elements are integrated on the back of the LA to realize the integration of the under-screen photosensitive element, the effective light-transmission area LA may meet the higher requirements of the photosensitive element for the light transmittance of the display panel 100. The orthographic projection of the effective photosensitive surface of the photosensitive element on the display panel 100 may be covered by the effective light-transmission area LA. In some embodiments, the shape of the effective light-transmission area LA matches the shape of the effective photosensitive surface of the photosensitive element. The effective light-transmission area LA may be an area on the display panel 100 that may both display and effectively transmit light. The wiring area WA may also be an area that can both display and effectively transmit light. In other embodiments, the light transmittance of the wiring area WA may be lower than the light transmittance of the effective light-transmission area LA.

Further, as shown in FIG. 1, the display panel 100 may include a gate driving circuit 10 disposed in the non-display area NA. The gate driving circuit 10 may be electrically connected to the first signal line 110 and the second signal line 120. The number of the gate driving circuit 10 may be one or two, and is not limited in this application.

In some embodiments, the circuit structures of the first pixel circuit C1, the second pixel circuit C2, and the third pixel circuit C3 may be same. For example, the three pixel circuits may all be 7T1C circuits. In other embodiments, the circuit structures of the three pixel circuits may also be different, and are not limited in this application.

In the second display area DA2, the second light-emitting unit LU2 and the second pixel circuit C2 and/or the first pixel circuit C1 may be misaligned. In the third display area DA3, the third light-emitting unit LU3 and the third pixel circuit C3 may be overlapped. Under such a configuration, the parasitic capacitances of the two display areas may be different. For example, the parasitic capacitance of the third display area DA3 may be greater than the parasitic capacitance of the second display area DA2.

In some embodiments, the first pixel circuit C1 may include a first driving transistor, the second pixel circuit C2 may include a second driving transistor, and the third pixel circuit C3 may include a third driving transistor. To compensate the difference in the parasitic capacitance of the two display areas, the width-to-length ratio of the channel of the third driving transistor may be set to be smaller than the width-to-length ratio of the channel of the second driving transistor, and the width-to-length ratio of the channel of the second driving transistor may be set to be equal to the width-to-length ratio of the channel of the first driving transistor.

Figure 16:
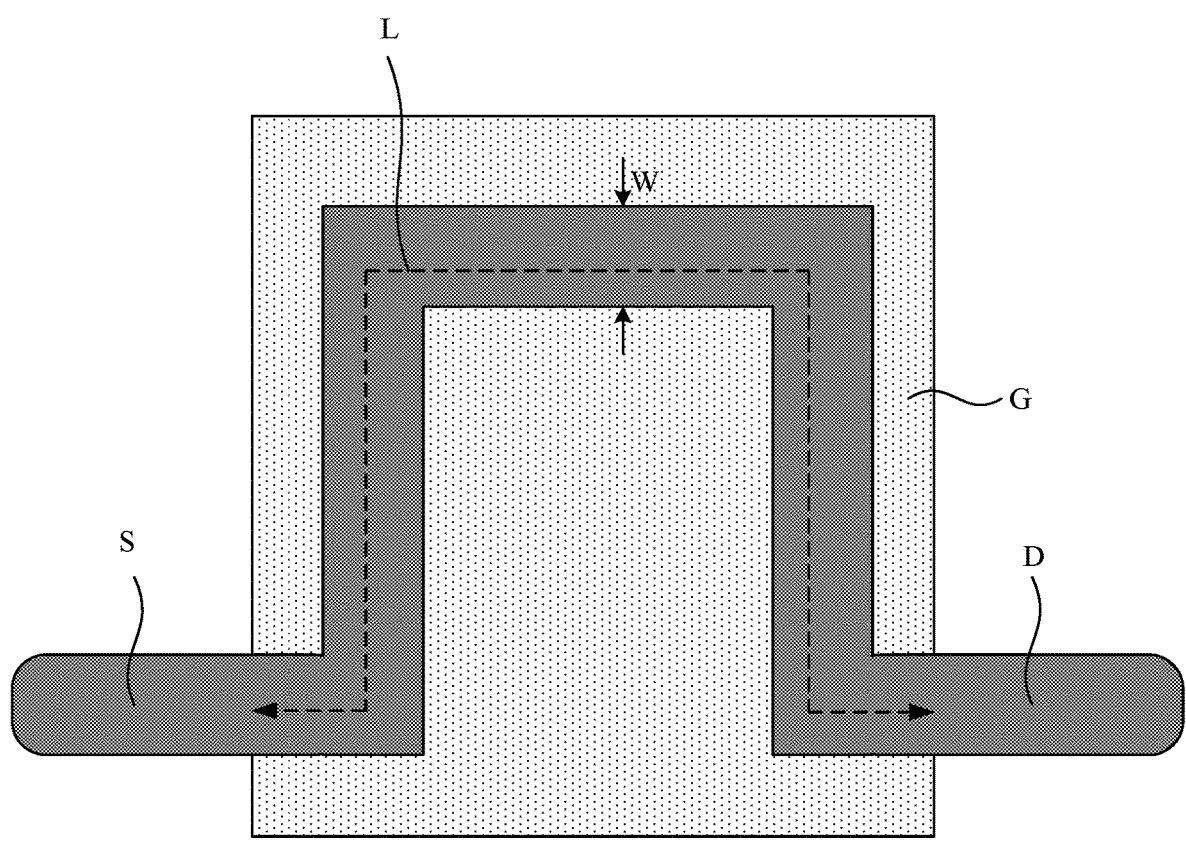
FIG. 16 illustrates a top view of an exemplary first driving transistor consistent with various disclosed embodiments of the present disclosure.

FIG. 16 shows a top view of an exemplary first driving transistor consistent with various disclosed embodiments of the present disclosure. As shown in FIG. 16, the first driving transistor may include a gate G, a semiconductor portion, a source S, and a drain D. The distance between the source S and the drain D may be the channel length L of the first driving transistor, and the channel width W of the first driving transistor may be perpendicular to the channel L. In one embodiment, the gate G may be made of metal.

It should be noted that there are various specific structures of the first driving transistor, and the first driving transistor shown in FIG. 16 is an "S"-shaped transistor. In one embodiment, the structures of the first driving transistor, the second driving transistor, and the third driving transistor may all be the "S"-shaped transistors as shown in FIG. 16. The first driving transistor, the second driving transistor, and the third driving transistor may also be transistors of other structures. The present disclosure will not list them one by one here. The specific structures of the first driving transistor, the second driving transistor, and the third driving transistor are limited by the present disclosure.

In other embodiments, the first pixel circuit C1 may include a first storage capacitor, the second pixel circuit C2 may include a second storage capacitor, and the third pixel circuit C3 may include a third storage capacitor. To compensate the difference between the parasitic capacitances of the two display areas, the orthographic projection area of the third storage capacitor on the light-exiting surface of the display panel may be set to be smaller than the orthographic projection area of the second storage capacitor on the light-exiting surface of the display panel. The orthographic projection area of the second storage capacitor on the light-exiting surface of the display panel may be set equal to the orthographic projection area of the first storage capacitor on the light-exiting surface of the display panel.

In some embodiments, to compensate the difference between the parasitic capacitances of the two display areas, a compensation algorithm may also be used for compensation, and may not be described in detail in the present disclosure.

Figure 17:
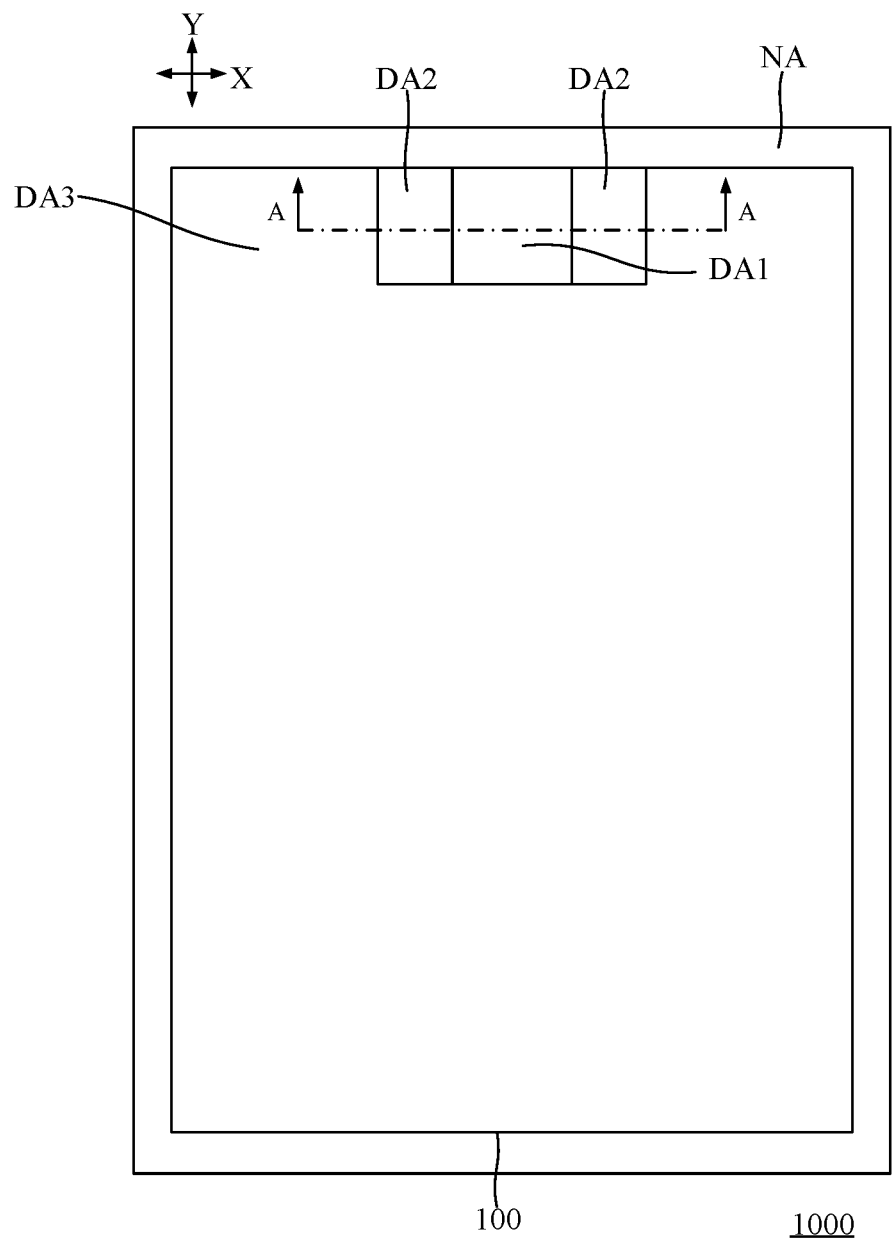
FIG. 17 illustrates a top view of an exemplary display device consistent with various disclosed embodiments of the present disclosure.

The present disclosure also provides a display device. FIG. 17 is a top view of an exemplary display device consistent with various disclosed embodiments of the present disclosure, and FIG. 18 is an A-A-sectional view in FIG. 17.

Figure 18:
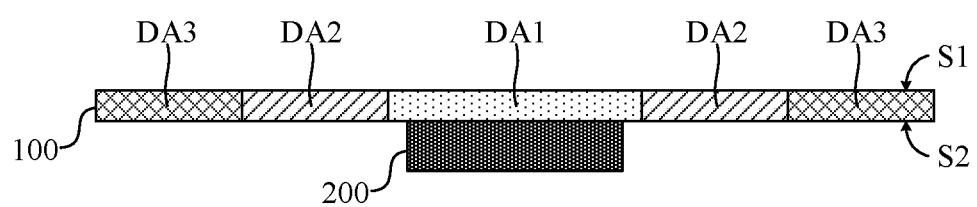
FIG. 18 illustrates an A-A sectional view of the display panel in FIG. 17.

As shown in FIGS. 17-18, the display device may include a display panel 100, and the display panel 100 may be the present disclosed display panel 100 described in one of the above embodiments, or other appropriate display panel. The display panel 100 may have a first display area DA1, a second display area DA2, and a third display area DA3. The light transmittance of the first display area DA1 may be greater than the light transmittance of the third display area DA3.

The display panel 100 may include a first surface S1 and a second surface S2 opposite to the first surface S1. The first surface S1 may be a display surface. The display device may further include a photosensitive component 200 disposed on the second surface S2 of the display panel 100. The photosensitive assembly 200 may correspond to the position of the first display area DA1.

The photosensitive component 200 may be an image capturing device for capturing external image information. In one embodiment, the photosensitive component 200 is a complementary metal oxide semiconductor (CMOS) image acquisition device. In some embodiments, the photosensitive component 200 may also be a charge-coupled device (CCD) image acquisition devices and other forms of image acquisition devices. It can be understood that the photosensitive component 200 may not be limited to an image acquisition device. For example, in some embodiments, the photosensitive component 200 may also be an infrared sensor, a proximity sensor, or other optical sensors.

According to the present disclosed display device, the light transmittance of the first display area DA1 may be greater than the light transmittance of the third display area DA3, Thus, the display panel 100 may integrate the photosensitive component 200 on the back of the first display area DA1 to realize under-the-screen integration of the photosensitive component 200 of the image acquisition device. At the same time, the first display area DA1 may be able to display pictures. The display area of the display panel 100 may be increased, and a full-screen design of the display device may be realized.

The display panel 100 may further include one or more first pixel circuits C1, one or more second pixel circuits C2, and one or more third pixel circuits C3. The one or more first pixel circuits C1 and the one or more second pixel circuits C2 may be disposed in the second display area DA2, and the one or more third pixel circuits C3 may be disposed in the third display area DA3. The display panel 100 may further include a first light-emitting unit LU1, a second light-emitting unit LU2, and a third light-emitting unit LU3. The first light-emitting unit LU1 may be disposed in the first display area DA1 as an array, the second light-emitting unit LU2 may be disposed in the second display area DA2 as an array, and the third light-emitting unit LU3 may be disposed in the third display area DA3 as an array.

The first light-emitting unit LU1 may include at least one first light-emitting element L1. The second light-emitting unit LU2 may include at least one second light-emitting element L2. The third light-emitting unit LU3 may include at least one third light-emitting element L3. The first pixel circuit C1 may be electrically connected to at least one first light-emitting element L1. The second pixel circuit C2 may be electrically connected to at least one second light-emitting element L2. The third pixel circuit C3 may be electrically connected to at least one third light-emitting element L3.

The display panel 100 may further include a plurality of first signal lines 110, and the plurality of first signal lines 110 may extend along the first direction X, and may be spaced apart along the second direction Y. Each first signal line 110 may be electrically connected to one or more first pixel circuits C1, one or more second pixel circuits C2, and one or more third pixel circuit C3.

The one or more of first pixel circuits C1 and the one or more third pixel circuits C3 electrically connected to each of at least a portion (a certain number) of the plurality of first signal lines 110 may be distributed in a staggered manner along the first direction X. That is, the one or more first pixel circuits C1 and the one or more third pixel circuits C3 that are electrically connected to each of the at least portion of the plurality of the first signal lines 110 are not aligned along the first direction X. In particular, the one or more of first pixel circuits C1 electrically connected to each of the at least portion of the first signal lines 110 may be shifted along the second direction Y relative to the one or more third pixel circuit C3 electrically connected to the same first signal lines 110. FIG. 2 shows that the first pixel circuits C1 electrically connected to the first signal line 110 may all be shifted upward by a certain distance along the second direction Y relative to the third pixel circuits C3 electrically connected to the same first signal line 110. Thus, the distance between the first pixel circuits C1 electrically connected to the same first signal line 100 and the first light-emitting element L1 along the second direction Y may be increased. In particular, the connection space between the first pixel circuits C1 electrically connected to the same first signal line 110 and the first light-emitting element L1 may be increased. Thus, more first connection lines CL1 may be disposed in the connection space. In particular, more first light-emitting elements L1 may be disposed in the limited first display area DA1; and the pixel density of the first display area DA1 may be increased.

Thus, in the present disclosed display panel and the display device, the light transmittance of the first display area may be greater than the light transmittance of the third display area. The display panel may include first signal lines, each of the first signal lines may be electrically connected to one or more first pixel circuits, one or more second pixel circuits, and one or more third pixel circuits. The one or more third pixel circuit and the one or more first pixel circuits electrically connected each of at least a portion of the first signal lines may have staggered distribution along a first direction. In particular, the first pixel circuits electrically connected to each of the at least portion of to the first signal lines may be shifted along the second direction relative to the third pixel circuits electrically connected to the same first signal line. Thus, the distance between the first pixel circuits electrically connected by a same signal line and the first light-emitting element along the second direction may be increased. In particular, the connection space between the first pixel circuits and the first light-emitting element electrically connected by the same first signal line may be increased. Thus, more first light-emitting elements may be disposed in the limited first display area. Accordingly, the pixel density of the first display area may be increased.

It should be noted that the above are only the preferred embodiments of the present disclosure and the applied technical principles. Those skilled in the art will understand that the present disclosure is not limited to the specific embodiments described herein, and various obvious changes, readjustments, mutual combinations and substitutions can be made to those skilled in the art without departing from the protection scope of the present disclosure. Therefore, although the present disclosure has been described in more detail through the above embodiments, the present disclosure is not limited to the above embodiments, and can also include more other equivalent embodiments without departing from the concept of the present disclosure. The scope of is determined by the scope of the appended claims.

What is claimed is:
1. A display panel, comprising:
a first display area, a second display area, and a third display area, wherein the second display area at least partially surrounds the first display area, the third display area at least partially surrounds the second display area and the first display area, and a light transmittance of the first display area is greater than a light transmittance of the third display area;
a plurality of first pixel circuits, at least partially disposed in the second display area;
a plurality of second pixel circuits, disposed in the second display area;
a plurality of third pixel circuits, disposed in the third display area;
a plurality of first light-emitting units, disposed in the first display area as an array, wherein a first light-emitting unit includes at least one first light-emitting element, and a first pixel circuit is electrically connected to at least one of the at least one first light-emitting element;
a plurality of second light-emitting units, disposed in the second display area as an array, wherein a second light-emitting unit includes at least one second light-emitting element, and a second pixel circuit is electrically connected to the at least one second light-emitting element;
a plurality of third light-emitting units, disposed in the third display area as an array, wherein a third light-emitting unit includes at least one third light-emitting element, and a third pixel circuit is electrically connected to the at least one third light-emitting element; and
a plurality of first signal lines, extending along a first direction and spaced apart along a second direction intersecting the first direction, wherein each first signal line of the plurality of first signal lines is electrically connected with one or more first pixel circuits of the plurality of first pixel circuits, one or more second pixel circuits of the plurality of second pixel circuits, and one or more third pixel circuits of the plurality of third pixel circuits, and the one or more first pixel circuits and the one or more third pixel circuits that are electrically connected to each of at least one portion of the first signal lines of the plurality of first signal lines are misaligned along the first direction.

2. The display panel according to claim 1, wherein:
along the first direction, all of the one or more first pixel circuits electrically connected to the at least one portion of the first signal lines are disposed at a side of all of the one or more second pixel circuits adjacent to the first display area; and
the one or more second pixel circuits and the one or more third pixel circuits that are electrically connected to a same first signal line of the plurality of first signal lines are aligned along the first direction; or the one or more first pixel circuits and the one or more second pixel circuits that are electrically connected to a same first signal line of the plurality of first signal lines are aligned along the first direction.

3. The display panel according to claim 1, wherein:
along the first direction, the one or more first pixel circuits and the one or more second pixel circuits that are electrically connected to a same first signal line of plurality of first signal lines are alternatively distributed; and
the one or more first pixel circuits and the one or more second pixel circuits electrically connected to the same first signal line of the plurality of first signal lines are aligned along the first direction.

4. The display panel according to claim 1, wherein:
the third display area includes a first sub-display area;
along the first direction, the first sub-display area is located at least one side of the second display area;
the second display area includes a second sub-display area;
along the first direction, the second sub-display area is located at least one side of the first display area;
a length of the first sub-display area along the second direction, a length of the second sub-display area along the second direction and a length of the first display area along the second direction are equal to each other;
in the first display area, the plurality of first light-emitting unit are disposed as n1 rows×m1 columns, wherein m1 and n1 are all integers greater than 1;
in the second sub-display area, the plurality of second light-emitting unit are disposed as n2 rows×m2 columns, wherein m2 and n2 are all integers greater than 1;
in the first sub-display area, the plurality of third light-emitting unit are disposed as n3 rows×m3 columns, wherein m3 and n3 are all integers greater than 1;
n1, n2 and n3 are equal to each other;
in the first display area, the plurality of first light-emitting units are aligned along the first direction and the second direction; and
in the second sub-display area, the plurality of second light-emitting units are aligned along the first direction and the second direction.

5. The display panel according to claim 4, wherein:
a first pixel circuit of the plurality of first pixel circuits is electrically connected with at least two first light-emitting elements through first connection lines.

6. The display panel according to claim 5, wherein:
all first light-emitting elements that are electrically connected to a same first connection line provide a same color; and
all the first light-emitting elements that are electrically connected to the same first connection line are configured to be adjacent to each other along the first direction.

7. The display panel according to claim 5, wherein:
at least first connection lines in the first display area are transparent conductive lines.

8. The display panel according to claim 1, wherein:
the third display area includes a first sub-display area;
along the first direction, the first sub-display area is located at least one side of the second display area;
the second display area includes a second sub-display area;
along the first direction, the second sub-display area is located at least one side of the first display area;
a length of the first sub-display area along the second direction, a length of the second sub-display area along the second direction and a length of the first display area along the second direction are equal to each other;
in the first display area, the plurality of first light-emitting units are disposed as n1 rows×m1 columns, wherein m1 and n1 are all integers greater than 1;
in the second sub-display area, the plurality of second light-emitting units are disposed as n2 rows×m2 columns, wherein m2 and n2 are all integers greater than 1;
in the first sub-display area, the plurality of third light-emitting units are disposed as n3 rows×m3 columns, wherein m3 and n3 are all integers greater than 1;
n1 is equal to n2;
n2 is smaller than n3;
the plurality of first light-emitting units are alternatively distributed along the first direction and the second direction; and
the plurality of second light-emitting units are alternatively distributed along the first direction and the second direction.

9. The display panel according to claim 1, wherein:
the one or more first pixel circuits that electrically connected to a same first signal line are aligned along the first direction and have a first central axis along the first direction;
the one or more third pixel circuits electrically connected to a same first signal line are aligned along the first direction and have a second central axis along the first;
the first central axis and the second central axis corresponding to the same first signal line have a first vertical distance along the second direction; and
all first vertical distances are equal to each other.

10. The display panel according to claim 1, wherein:
along the second direction, the display panel includes a first edge and a second edge opposing to the first edge;
the one or more first pixel circuits that are electrically connected to a same first signal line are aligned along the first direction and have a first central axis along the first direction;
the one or more third pixel circuits that are electrically connected to a same first signal line are aligned along the first direction and have a second central axis along the first direction;
the first central axis and the second central axis corresponding to the same first signal line have a first vertical distance along the second direction;
first central axis corresponding to the same first signal line are located at a side of the second central axis adjacent to the first edge and, along a direction away from the first edge, first vertical distances are gradually reduced; or
first central axis corresponding to the same first signal line are located at a side of the second central axis adjacent to the second edge and, along a direction away from the second edge, first vertical distances are gradually reduced.

11. The display panel according to claim 9, wherein:
along the second direction, adjacent first central axis have a second vertical distance; and
at least a portion of second vertical distances are equal to each other.

12. The display panel according to claim 10, wherein:
along the second direction, adjacent first central axis have a second vertical distance; and
at least a portion of second vertical distances are equal to each other.

13. The display panel according to claim 10, wherein:
second light-emitting units electrically connected to a same first signal line are aligned along the first direction and have a third central axis along the first direction;
along the second direction, adjacent third central axis have a third vertical distance; and
the first vertical distance is smaller than the third vertical distance.

14. The display panel according to claim 10, wherein:
the first vertical distance is smaller than, or equal to approximately 200 μm.

15. The display panel according to claim 1, wherein:
the first display area is a circular area;
along the second direction, the display panel has a first edge and a second edge opposite to the first edge;
the one or more first pixel circuits that are electrically connected to a same first signal line are aligned along the first direction and have a first central axis along the first direction;
the one or more third pixel circuits electrically connected to a same first signal line are aligned along the first direction and have a second central axis along the first direction;
along the second direction, the first central axis and the second central axis corresponding the first signal line have a first vertical distance;
a number of the plurality of first signal lines is N, N being an integer greater than 1,
when N is an odd number, along a direction from an i-th first signal line to the first edge and a direction from the i-th first signal line to the second edge, first vertical distances are all gradually reduced, wherein i=(N+1)/2; and
when N is an even number, along a direction from an i-th first signal line to the first edge and a direction from the (i+1)th first signal line to the second edge, all first vertical distances are gradually reduced, and the first vertical distance corresponding to the i-th first signal line and the first vertical distance corresponding to the (i+1)th first signal line are equal, wherein i=(N+1)/2.

16. The display panel according to claim 1, wherein:
along the second direction, the display panel includes a first edge and a second edge opposite to the first edge;
the display panel also includes a non-display area at least partially surrounding the first display area, the second display area and the third display area;
along the second direction, the second display area and the first edge are spaced by the non-display area and the second display area and the second edge are spaced by the third display area and the non-display area; and
the one or more first pixel circuits that electrically connected to a first signal line adjacent to the first edge are at least partially disposed in the non-display area.

17. The display panel according to claim 1, wherein:
a first signal line of the plurality of first signal lines includes a first segment, a connection segment and a second segment connected to each other;
the first segment is disposed in the third display area and extends along the first direction;
the second segment is disposed in the second display area and extends along the first direction; and
the connection segment is connected between the first segment and the second segment and extends along a third direction intersecting both the first direction and the second direction.

18. The display panel according to claim 1, wherein:
a first pixel circuit includes a first driving transistor;
a second pixel circuit includes a second driving transistor;
a third pixel circuit includes a third driving transistor;
a width-to-length ratio of a channel of the third driving transistor is smaller than a width-to-length ratio of a channel of the second driving transistor; and
the width-to-length ratio of the channel of the second driving transistor is equal to a width-to-length ratio of a channel of the first driving transistor.

19. The display panel according to claim 1, wherein:
a first pixel circuit includes a first storage capacitor;
a second pixel circuit includes a second storage capacitor;
a third pixel circuit includes a third storage capacitor;
an orthogonal projection area of the third storage capacitor on a light-exiting surface of the display panel is smaller than an orthogonal projection area of the second storage capacitor on the light-exiting surface of the display panel; and
the orthogonal projection area of the second storage capacitor on the light-exiting surface of the display panel is smaller than an orthogonal projection area of the first storage capacitor on the light-exiting surface of the display panel.

20. A display device, comprising:
a display panel,
wherein the display panel includes:
a first display area, a second display area and a third display area, wherein the second display area at least partially surrounds the first display area, the third display area at least partially surrounds the second display area and the first display area, and a light transmittance of the first display area is greater than a light transmittance of the third display area;
a plurality of first pixel circuits, at least partially disposed in the second display area;
a plurality of second pixel circuits, disposed in the second display area;
a plurality of third pixel circuit, disposed in the third display area;
a plurality of first light-emitting units, disposed in the first display area as an array, wherein a first light-emitting unit includes at least one first light-emitting element, and a first pixel circuit is electrically connected to the at least one first light-emitting element;
a plurality of second light-emitting units, disposed in the second display area as an array, wherein a second light-emitting unit includes at least one second light-emitting element, and a second pixel circuit is electrically connected to the at least one second light-emitting element;
a third light-emitting unit, disposed in the third display area as an array, wherein the third light-emitting unit includes at least one third light-emitting element, and a third pixel circuit is electrically connected to the at least one third light-emitting element; and a plurality of first signal lines, extending along a first direction and spaced apart along a second direction intersecting the first direction, wherein each first signal line of the plurality of first signal lines is electrically connected with one or more first pixel circuits of the plurality of first pixel circuits, one or more second pixel circuits and one or more third pixel circuits of the plurality of third pixel circuits, and the one or more first pixel circuit and the one or more third pixel circuits that electrically connected to each of at least one portion of first signal lines of the plurality of first signal lines are misaligned along the first direction.

* * * * *